US012610561B2

(12) United States Patent
Choi et al.

(10) Patent No.: US 12,610,561 B2
(45) Date of Patent: Apr. 21, 2026

(54) METHOD FOR FABRICATING A SEMICONDUCTOR DEVICE HAVING BACK GATE ELECTRODES, ACTIVE LAYERS, AND DATA LINES

(71) Applicant: Samsung Electronics Co., Ltd., Suwon-si (KR)

(72) Inventors: Hyungeun Choi, Suwon-si (KR); Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 293 days.

(21) Appl. No.: 18/236,607

(22) Filed: Aug. 22, 2023

(65) Prior Publication Data

US 2024/0074212 A1     Feb. 29, 2024

(30) Foreign Application Priority Data

Aug. 24, 2022     (KR) ......................... 10-2022-0106350

(51) Int. Cl.
*H10B 80/00*     (2023.01)
*H01L 23/00*     (2006.01)
(Continued)

(52) U.S. Cl.
CPC ............. *H10B 80/00* (2023.02); *H01L 24/08* (2013.01); *H01L 24/80* (2013.01); *H01L 25/0657* (2013.01); *H01L 25/18* (2013.01); *H01L 25/50* (2013.01); *H10B 12/315* (2023.02); *H01L 2224/08145* (2013.01); *H01L 2224/80895* (2013.01); *H01L 2224/80896* (2013.01);
(Continued)

(58) Field of Classification Search
CPC .... H10B 12/315; H10B 12/05; H10B 12/488; H10B 12/482; H10B 12/50; H10B 12/03; H10B 12/02; H10B 12/09; H10B 12/033; H10B 12/48; H10B 80/00; H01L 24/08; H01L 24/80; H01L 24/05; H01L 25/0657; H01L 25/18; H01L 25/50; H01L 2224/08145; H01L 2224/80895; H01L 2224/80896; H01L 2924/1431; H01L 2924/1436
See application file for complete search history.

(56) References Cited

U.S. PATENT DOCUMENTS 5,656,842 A     8/1997 Iwamatsu et al.
2008/0225588 A1     9/2008 Jin et al.
(Continued)

FOREIGN PATENT DOCUMENTS

| KR | 1020060114991 A | 11/2006 |
| KR | 100673012 B1 | 1/2007 |
| TW | 202230630 A | 8/2022 |

*Primary Examiner* — Wael M Fahmy
*Assistant Examiner* — Tiberiu Dan Onuta
(74) *Attorney, Agent, or Firm* — Muir Patent Law, PLLC

(57) ABSTRACT

A method of fabricating a semiconductor device may use, as an internal contact region, a region in which a memory cell region overlaps a core and/or peripheral region by bonding at least a partial region of the memory cell region to at least a partial region of the core and/or peripheral region by a direct bonding method, and thus, even when an additional contact region is secured outside the memory cell region to be smaller, signals and/or power may be transmitted between the memory cell region and the core and/or peripheral region.

20 Claims, 31 Drawing Sheets

(51) Int. Cl.
    *H01L 25/00*        (2006.01)
    *H01L 25/065*     (2023.01)
    *H01L 25/18*      (2023.01)
    *H10B 12/00*     (2023.01)

(52) U.S. Cl.
    CPC ................. *H01L 2924/1431* (2013.01); *H01L 2924/1436* (2013.01)

(56)             References Cited

U.S. PATENT DOCUMENTS

| | | | |
|---|---|---|---|
| 2012/0161229 A1 | 6/2012 | Kwon et al. | |
| 2020/0328190 A1* | 10/2020 | Liu | H01L 24/94 |
| 2021/0398569 A1* | 12/2021 | Hong | H10B 12/485 |
| 2022/0037326 A1* | 2/2022 | Han | H10B 12/05 |
| 2022/0122980 A1 | 4/2022 | Han et al. | |
| 2022/0139918 A1 | 5/2022 | Lee | |
| 2022/0181329 A1* | 6/2022 | Choi | H10B 12/50 |

\* cited by examiner

METHOD FOR FABRICATING A SEMICONDUCTOR DEVICE HAVING BACK GATE ELECTRODES, ACTIVE LAYERS, AND DATA LINES

CROSS-REFERENCE TO RELATED APPLICATION

This application is based on and claims priority under 35 U.S.C. § 119 to Korean Patent Application No. 10-2022-0106350, filed on Aug. 24, 2022, in the Korean Intellectual Property Office, the disclosure of which is incorporated by reference herein in its entirety.

BACKGROUND

The inventive concept relates to a method of fabricating a semiconductor device, and more particularly, to a method of fabricating a semiconductor device including a vertical channel transistor.

The integration of semiconductor devices needs to be increased to satisfy high performance and economic feasibility. In particular, the integration of memory devices is a significant factor for determining the economic feasibility of products. The integration of two-dimensional memory devices is mainly determined by an area occupied by unit memory cells, and thus is greatly affected by the level of fine pattern formation technology. However, high-priced equipment is needed to form fine patterns, and an area of a chip die is limited, and thus, the integration of two-dimensional memory devices has increased, but is still limited.

SUMMARY

The inventive concept provides a method of fabricating a semiconductor device having improved integration and electrical characteristics, and including a vertical channel transistor.

An object to be achieved by the spirit of the inventive concept is not limited to the above-mentioned object, and other objects that are not mentioned will be clearly understood by one of ordinary skill in the art from the following description.

According to an aspect of the inventive concept, a method of fabricating a semiconductor device includes providing a first substrate including a buried insulating layer and an active layer in a memory cell region, forming, within the active layer, a back gate electrode extending in a first direction, forming first and second active patterns on the buried insulating layer by patterning the active layer, wherein a first side of the first active pattern and a second side of the second active pattern are disposed on opposite sides of the back gate electrode, respectively, forming first and second word lines on a third side, opposite to the first side, of the first active pattern and on a fourth side, opposite to the second side, of the second active pattern, forming a bit line contacting first surfaces of the first and second active patterns and extending in a second direction across the first and second word lines, bonding a second substrate onto the bit line, exposing second surfaces, opposite to the first surfaces, of the first and second active patterns by removing the first substrate and the buried insulating layer, forming first and second contact patterns contacting the second surfaces of the first and second active patterns, respectively, forming first and second capacitors electrically connected to the first and second contact patterns, respectively, bonding a third substrate onto the first and second capacitors, exposing the bit line by removing the second substrate, and forming a first bonding pad electrically connected to the bit line.

According to an aspect of the inventive concept, a method of fabricating a semiconductor device includes forming, on a first substrate, a buried insulating layer, a back gate electrode extending in a first direction on the buried insulating layer, and first and second active patterns on the buried insulating layer, wherein a first side of the first active pattern and a second side of the second active pattern are disposed on opposite sides of the back gate electrode, respectively, forming first and second word lines on a third side, opposite to the first side, of the first active pattern and a fourth side, opposite the second side, of the second active pattern, forming a bit line contacting the first and second active patterns and extending in a second direction across the first and second word lines, forming a second bonding interface layer including an insulating material on the bit line, and bonding a second substrate onto the bit line, removing the first substrate and the buried insulating layer to expose the first and second active patterns, forming first and second contact patterns contacting the first and second active patterns, respectively, forming first and second landing pads contacting the first and second contact patterns, respectively, forming first and second storage electrodes electrically connected to the first and second landing pads, respectively, forming a capacitor dielectric layer and a plate electrode to cover the first and second storage electrodes, forming a third bonding interface layer including an insulating material on the plate electrode, and bonding a third substrate onto the plate electrode, removing the second substrate to expose the second bonding interface layer, forming a first bonding via passing through the second bonding interface layer and electrically connected to the bit line, and forming a first bonding pad contacting the first bonding via.

According to an aspect of the inventive concept, a method of fabricating a semiconductor device includes fabricating a first semiconductor chip including a memory cell region, fabricating a second semiconductor chip including a core/peripheral region, and directly bonding the first semiconductor chip to the second semiconductor chip. The fabricating of the first semiconductor chip includes providing a first substrate including a buried insulating layer and an active layer in the memory cell region, forming, within the active layer, a back gate electrode extending in a first direction, forming first and second active patterns on the buried insulating layer by patterning the active layer, wherein a first side of the first active pattern and a second side of the second active pattern are disposed on opposite sides of the back gate electrode, respectively, forming first and second word lines on a third side, opposite to the first side, of the first active pattern and on a fourth side, opposite to the second side, of the second active pattern, forming a bit line contacting first surfaces of the first and second active patterns and extending in a second direction across the first and second word lines, bonding a second substrate onto the bit lines, exposing second surfaces, opposite to the first surfaces, of the first and second active patterns by removing the first substrate and the buried insulating layer, forming first and second contact patterns contacting the second surfaces of the first and second active patterns, respectively, forming first and second capacitors electrically connected to the first and second contact patterns, respectively, bonding a third substrate onto the first and second capacitors, exposing the bit line by removing the second substrate, and forming a first bonding pad electrically connected to the bit line. The fabricating of the second semiconductor chip includes providing a fourth substrate including a peripheral circuit in the core/peripheral region and an insulating layer covering the peripheral circuit, and forming second bonding pads disposed on the insulating layer and electrically connected to the peripheral circuit. The directly bonding of the first semiconductor chip to the second semiconductor chip includes bonding the first bonding pad to a corresponding second bonding pad of the second bonding pads, and exposing the first and second capacitors by removing the third substrate.

BRIEF DESCRIPTION OF THE DRAWINGS

Embodiments will be more clearly understood from the following detailed description taken in conjunction with the accompanying drawings in which:

FIGS. 8 to 31 are cross-sectional views illustrating, in a process order, a method of fabricating a semiconductor device, according to an embodiment.

DETAILED DESCRIPTION OF THE
EMBODIMENTS

Hereinafter, embodiments will be described in detail with reference to the accompanying drawings.

Figure 1:
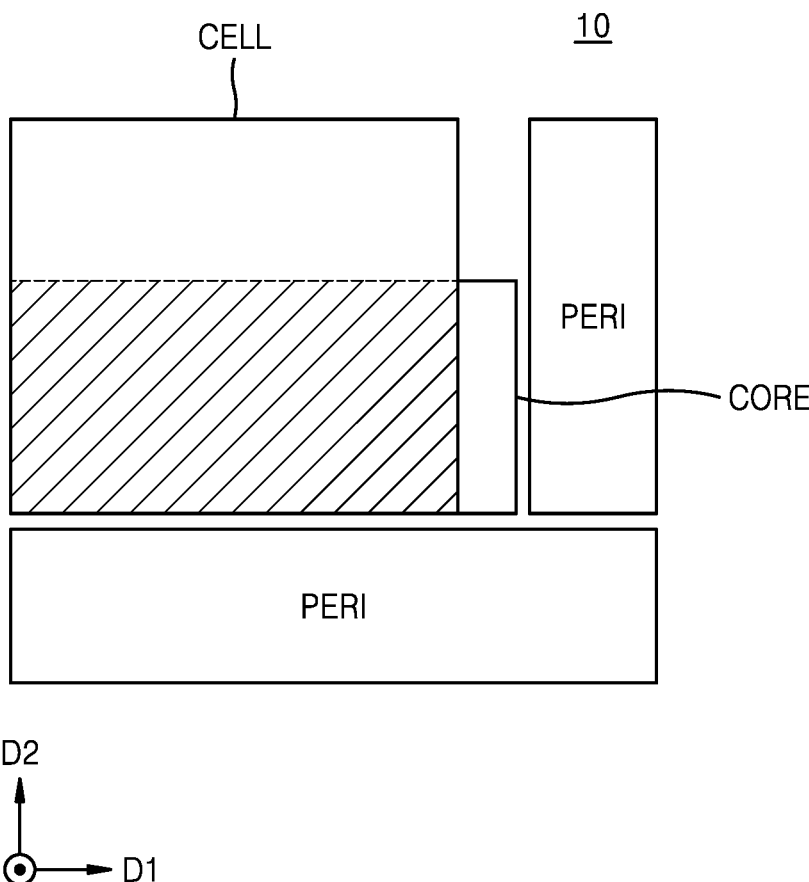
FIG. 1 is a plan layout illustrating a semiconductor device according to an embodiment.
Figure 2:
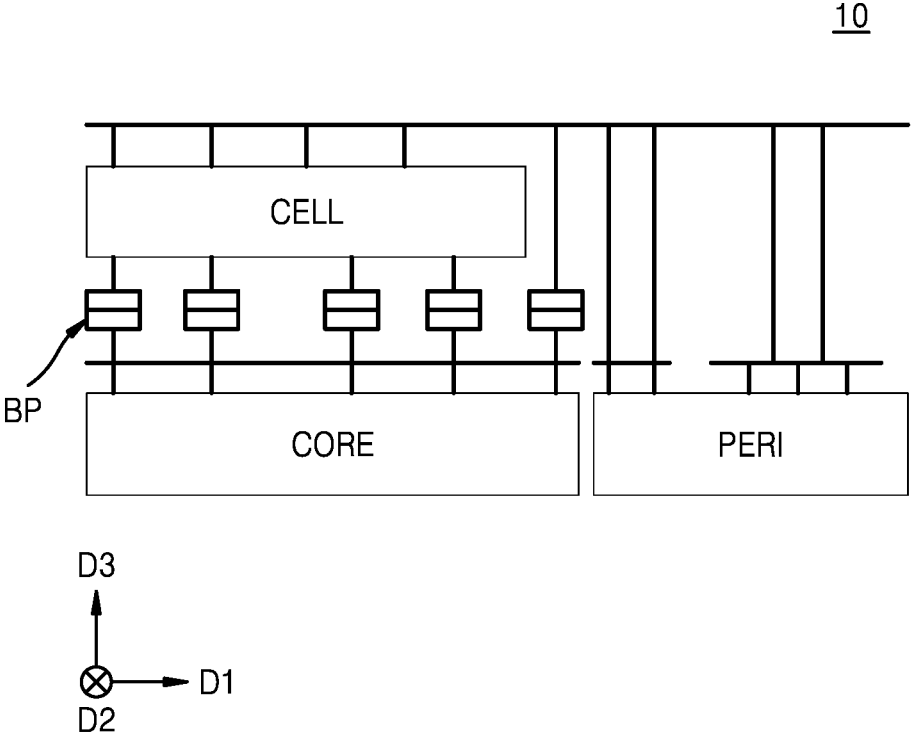
FIG. 2 is a side layout illustrating the semiconductor device of FIG. 1.
Figure 3:
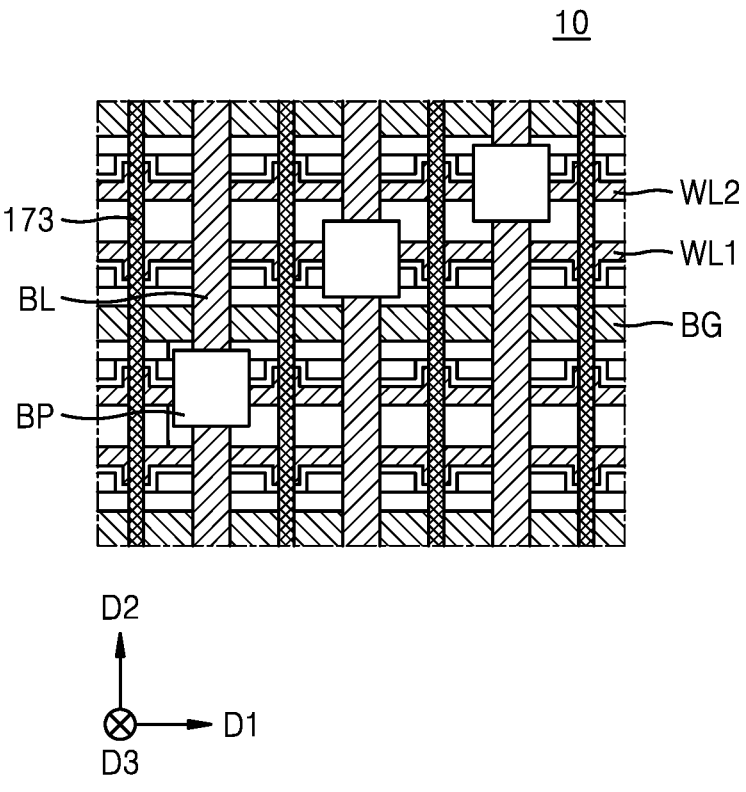
FIG. 3 is a schematic view illustrating an arrangement of bonding pads of the semiconductor device of FIG. 1.

FIG. 1 is a plan layout illustrating a semiconductor device according to an embodiment, FIG. 2 is a side layout illustrating the semiconductor device of FIG. 1, and FIG. 3 is a schematic view illustrating an arrangement of bonding pads of the semiconductor device of FIG. 1.

Referring to FIGS. 1 to 3 together, a semiconductor device 10 may include a memory cell region CELL and core/peripheral regions CORE and PERI.

The semiconductor device 10 of the inventive concept may have a chip-to-chip structure. Here, the chip-to-chip structure may be constituted by fabricating a first chip including the memory cell region CELL on a first wafer, fabricating a second chip including the core/peripheral regions CORE and PERI on a second wafer, and then connecting the first chip and the second chip with each other by a direct bonding method.

In some embodiments, the direct bonding method may refer to a method of electrically connecting a bonding pad BP formed on an uppermost layer of the first chip to a bonding pad BP formed on an uppermost layer of the second chip. For example, when the bonding pads BP are formed of copper (Cu), the direct bonding method may be a copper-to-copper (Cu-to-Cu) direct bonding method, but is not limited thereto.

The bonding pads BP may be disposed on bit lines BL. In some embodiments, the bonding pads BP may be arranged to be spaced apart from each other in a diagonal direction with respect to a first direction D1 and a second direction D2. In some embodiments, the bonding pads BP may be arranged to be spaced apart from each other at central points and vertices of a honeycomb shape. The bonding pads BP, when viewed in a plan view, may have, for example, a rectangular shape.

In the semiconductor device 10 of the inventive concept, the memory cell region CELL may be disposed on at least partial regions of the core/peripheral regions CORE and PERI. In some embodiments, the memory cell region CELL may be arranged to overlap the core region CORE in a vertical direction D3. In some embodiments, the memory cell region CELL may be arranged to overlap the peripheral region PERI in the vertical direction D3.

The memory cell region CELL may refer to a region in which memory cells formed on a semiconductor substrate are arranged. Cell transistors of each memory cell arranged in the memory cell region CELL may be vertical channel transistors (VCTs), and a data storage device of each memory cell may include a capacitor. The VCTs may refer to a structure in which a channel length of channel layers constituting transistors extends from a substrate in the vertical direction D3.

In addition, the core/peripheral regions CORE and PERI may refer to regions in which peripheral circuits are disposed on a semiconductor substrate. For example, peripheral circuits may operate to transmit signals and/or power to memory cells. In some embodiments, peripheral circuits may include various types of circuits, such as a command decoder, a control logic, an address buffer, a row decoder, a column decoder, a sense amplifier, a sub word line driver, and data input/output circuits, but are not limited thereto.

As described above, a region in which the memory cell region CELL overlaps the core/peripheral regions CORE and PERI may be used as an internal contact region by bonding at least some regions of the memory cell region CELL and the core/peripheral regions CORE and PERI by a direct bonding method. Therefore, an additional contact region outside the memory cell area CELL may be reduced for transmission of signals and/or power between the memory cell region CELL and the core/peripheral regions CORE and PERI. As will be described later, according to a method of fabricating the semiconductor device 10 according to the inventive concept, a direct bonding method may be implemented more efficiently (e.g., using the overlapping area between the memory cell region CELL and the core/peripheral regions CORE and PERI) while forming a VCT including a back gate electrode.

Therefore, using a direct bonding method of bonding the memory cell region CELL to the core/peripheral regions CORE and PERI according to the inventive concept of fabricating the semiconductor device 10 including VCTs, integration and electrical characteristics of the semiconductor device 10 may be improved. The direct bonding method may include a (Cu-to-Cu) direct bonding method.

Figure 4:
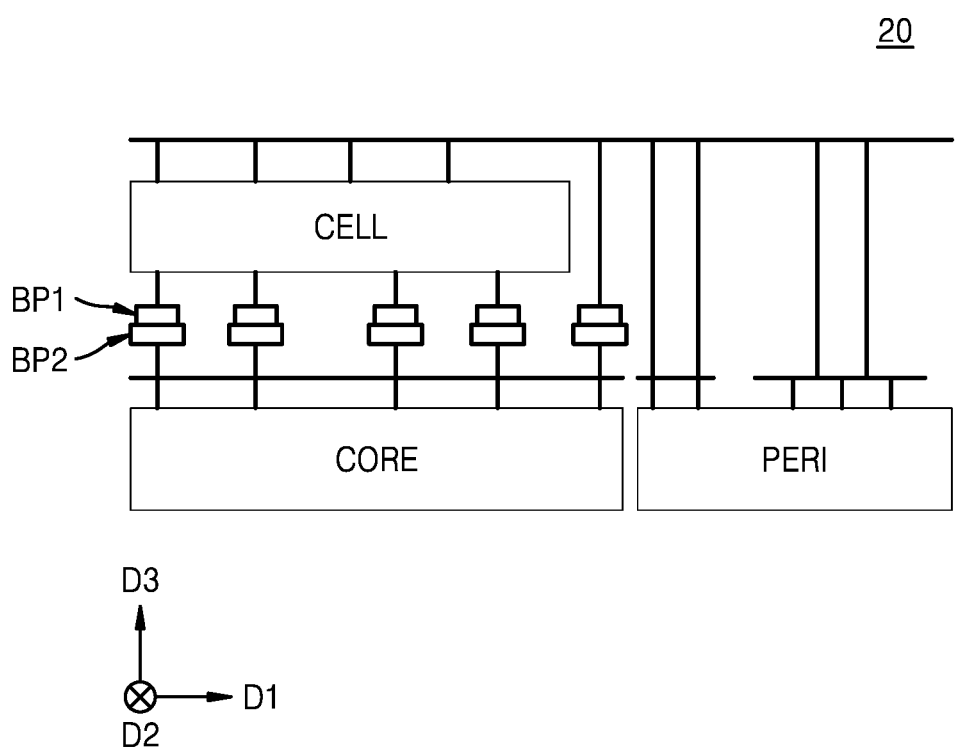
FIG. 4 is a side layout illustrating a semiconductor device according to some embodiments.

FIG. 4 is a side layout illustrating a semiconductor device according to some embodiments.

Most components constituting a semiconductor device 20 described below and materials constituting the components are substantially the same as or similar to those described with reference to FIGS. 1 to 3. Therefore, for convenience of description, a difference from the semiconductor device 10 described above will be mainly described.

Referring to FIG. 4, the semiconductor device 20 may include a memory cell region CELL and core/peripheral regions CORE and PERI.

The semiconductor device 20 of the present embodiment may have a structure in which a first chip including the memory cell region CELL and a second chip including the core/peripheral regions CORE and PERI are connected with each other by a direct bonding method.

The direct bonding method may refer to a method of electrically connecting a first bonding pad BP1 formed on an uppermost layer of the first chip to a second bonding pad BP2 formed on an uppermost layer of the second chip. For example, when each of the first bonding pad BP1 and the second bonding pad BP2 is formed of copper (Cu), the direct bonding method may be a (Cu-to-Cu) direct bonding method, but is not limited thereto.

Here, a first width of the first bonding pad BP1 and a second width of the second bonding pad BP2 may be different from each other. In some embodiments, as illustrated in FIG. 4, the first width of the first bonding pad BP1 may be less than the second width of the second bonding pad BP2. In some embodiments, unlike being illustrated in FIG. 4, the first width of the first bonding pad BP1 may be greater than the second width of the second bonding pad BP2. The present invention is not limited thereto. In some embodiments, the first bonding pad BP1 and the second bonding pad BP2 may have the same contact area.

Figure 5:
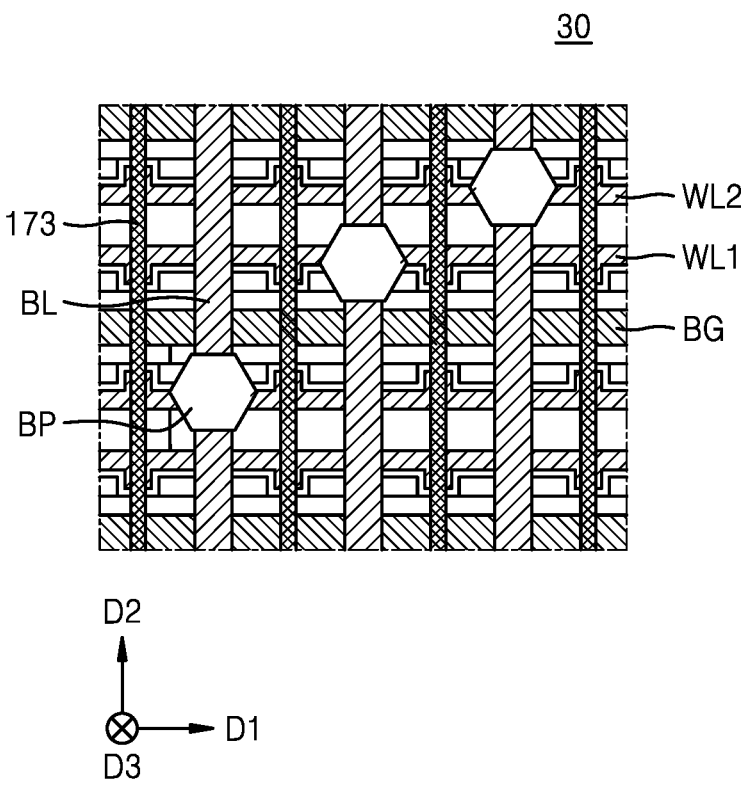
FIGS. 5 and 6 are schematic views illustrating arrangements of bonding pads of a semiconductor device, according to some embodiments.
Figure 6:
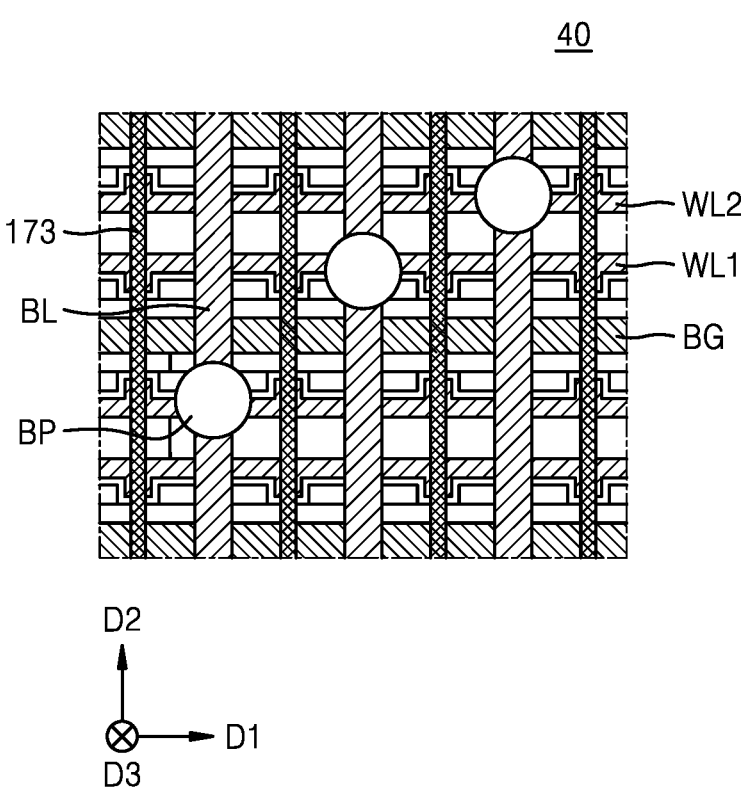

FIGS. 5 and 6 are schematic views illustrating arrangements of bonding pads of a semiconductor device, according to some embodiments.

Most components constituting semiconductor devices 30 and 40 described below and materials constituting the components are substantially the same as or similar to those described above with reference to FIGS. 1 to 3. Therefore, for convenience of description, differences from the semiconductor device 10 described above will be mainly described.

Referring to FIG. 5, the semiconductor device 30 may have a chip-to-chip structure constituted by a direct bonding method.

In the semiconductor device 30 of the present embodiment, the direct bonding method may refer to a method of electrically connecting a bonding pad BP formed on an uppermost layer of a first chip to a bonding pad BP formed on an uppermost layer of a second chip. For example, when the bonding pads BP are formed of copper (Cu), the direct bonding method may be a (Cu-to-Cu) direct bonding method. For example, the bonding pads BP may have a rhombus shape or a hexagonal shape.

Referring to FIG. 6, the semiconductor device 40 may have a chip-to-chip structure constituted by a direct bonding method.

In the semiconductor device 40 of the present embodiment, the direct bonding method may refer to a method of electrically connecting a bonding pad BP formed on an uppermost layer of a first chip to a bonding pad BP formed on an uppermost layer of a second chip. For example, when the bonding pads BP are formed of copper (Cu), the direct bonding method may be a (Cu-to-Cu) direct bonding method. For example, the bonding pads BP, when viewed in a plan view, may have a circular shape or an elliptical shape.

Figure 7:
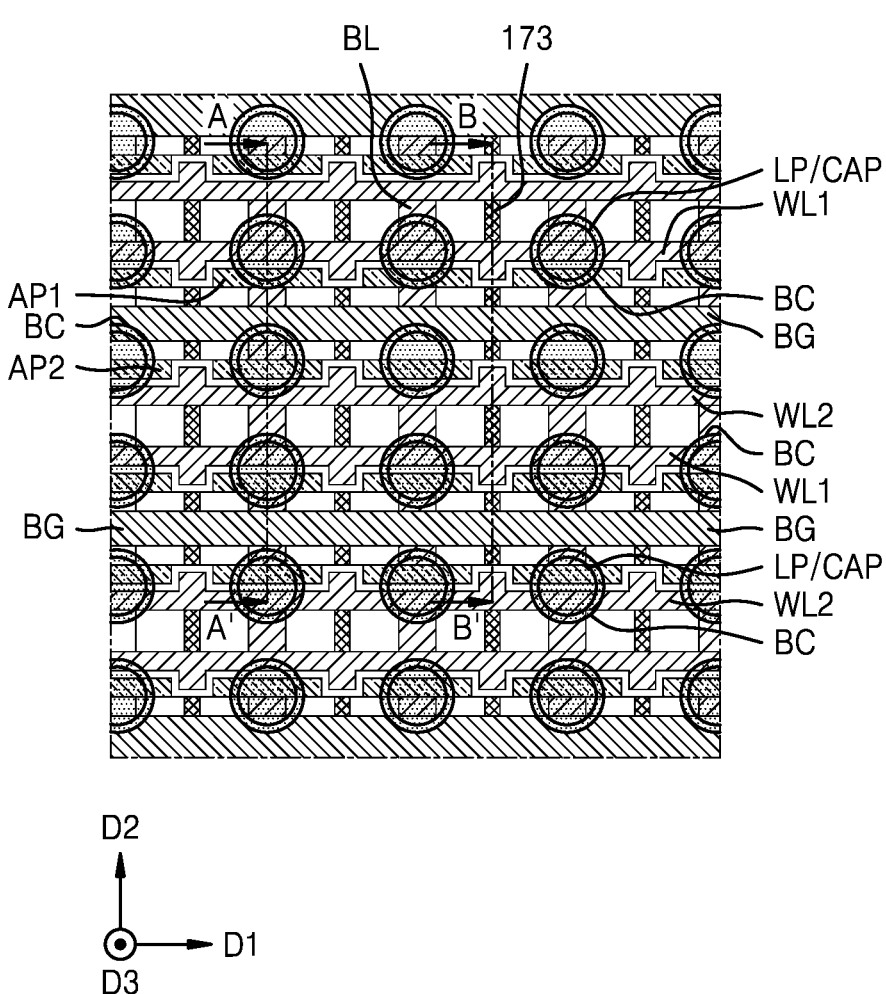
FIG. 7 is an enlarged layout illustrating a semiconductor device according to an embodiment.

FIG. 7 is an enlarged layout illustrating a semiconductor device according to an embodiment, and FIGS. 8 to 31 are cross-sectional views illustrating, in a process order, a method of fabricating a semiconductor device, according to an embodiment.

In detail, FIGS. 8 to 31 illustrate cross-sections taken along lines A-A' and B-B' of FIG. 7, respectively.

Figure 8:
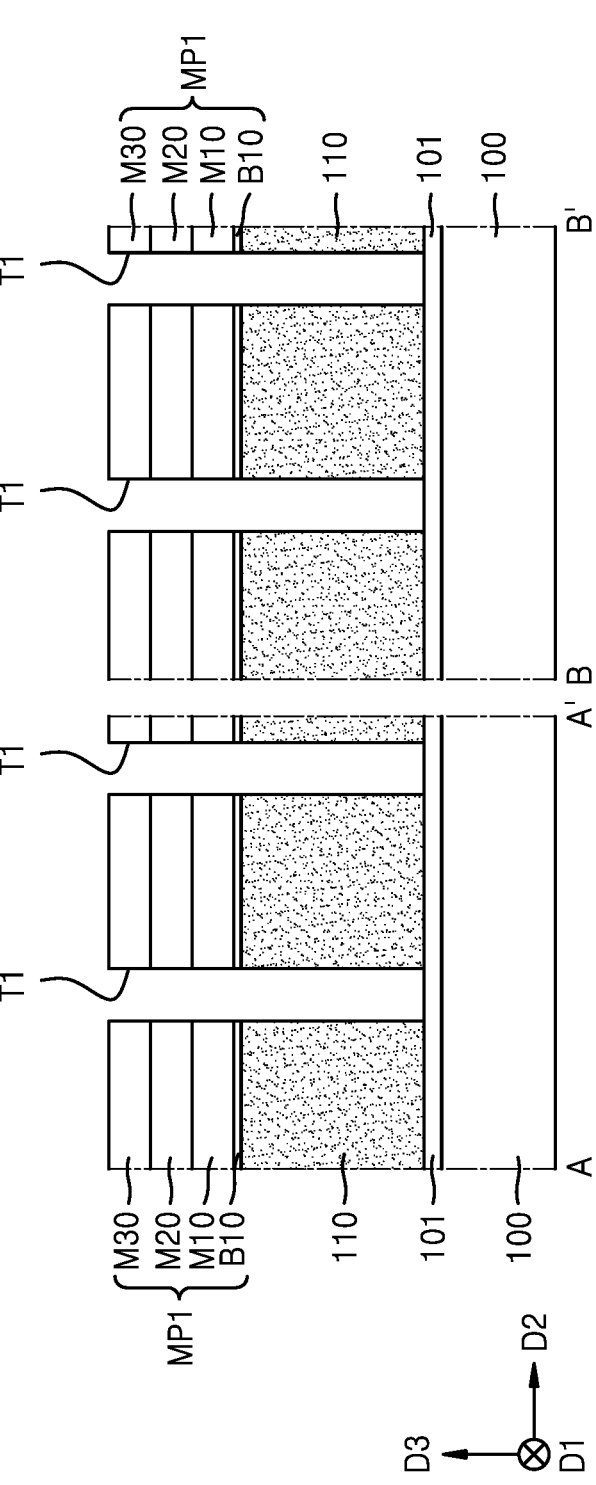

Referring to FIGS. 7 and 8 together, a first substrate 100 including a buried insulating layer 101 and an active layer 110 may be provided.

The first substrate 100 may be a silicon on insulator (SOI) substrate. Alternatively, the first substrate 100 may be, for example, a silicon substrate, a germanium substrate, a silicon-germanium substrate, or the like.

The buried insulating layer 101 and the active layer 110 may be provided on the first substrate 100. The first substrate 100 may include a memory cell region CELL (refer to FIGS. 28 to 31).

The buried insulating layer 101 may be, for example, buried oxide. Alternatively, the buried insulating layer 101 may be an insulating layer formed by a chemical vapor deposition method. The buried insulating layer 101 may include or may be formed of, for example, silicon oxide, silicon nitride, silicon oxynitride, and/or a low-k dielectric material.

The active layer 110 may be a single crystal semiconductor material. The active layer 110 may have a first surface and a second surface opposite to each other, and the second surface may be a surface contacting the buried insulating layer 101. The term "contact," as used herein, refers to a direct connection (i.e., touching) unless the context indicates otherwise.

A first mask pattern MP1 may be formed on the first surface of the active layer 110. The first mask pattern MP1 may have line-shaped openings extending in a first direction D1 in the memory cell region CELL.

The first mask pattern MP1 may include a buffer layer B10, a first mask layer M10, a second mask layer M20, and a third mask layer M30 that are sequentially stacked. Here, the third mask layer M30 may include or may be formed of a material having etch selectivity with respect to the second mask layer M20. The first mask layer M10 may include or may be formed of a material having etch selectivity with respect to the buffer layer B10 and the second mask layer M20. In some embodiments, the buffer layer B10 and the second mask layer M20 may include or may be formed of silicon oxide, and the first mask layer M10 and the third mask layer M30 may include or may be formed of silicon nitride.

Subsequently, the active layer 110 of the memory cell region CELL may be anisotropically etched by using the first mask pattern MP1 as an etching mask. Accordingly, first trenches T1 extending in the first direction D1 may be formed in the active layer 110 of the memory cell region CELL. The first trenches T1 may expose the buried insulating layer 101, and may be spaced apart from each other by a certain distance in a second direction D2.

Figure 9:
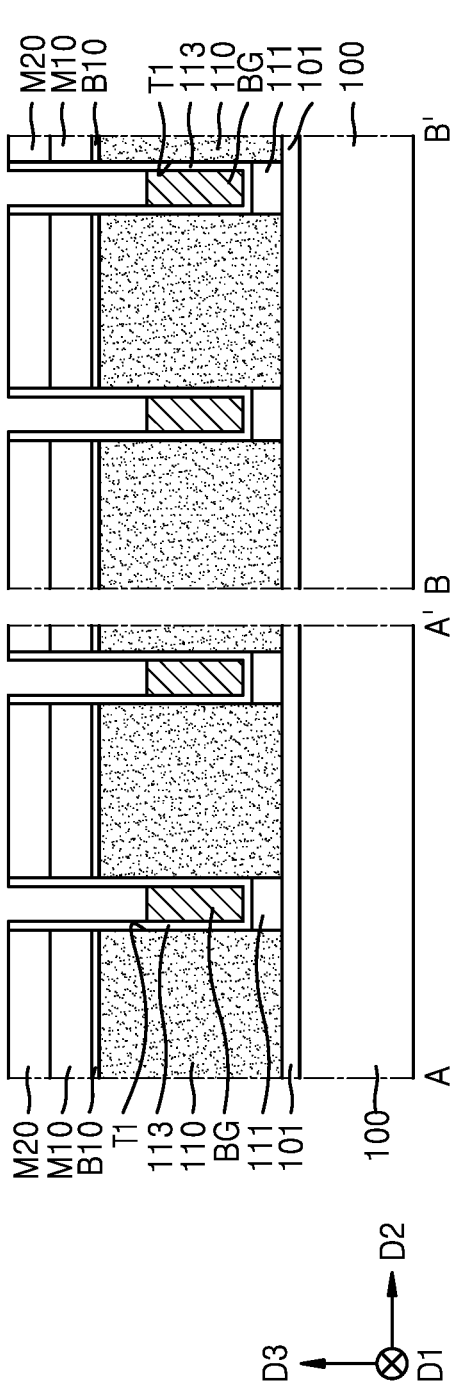

Referring to FIGS. 7 and 9 together, first insulating patterns 111 filling lower portions of the first trenches T1 may be formed.

The first insulating patterns 111 may be formed by forming an insulating material to fill the first trenches T1 and then etching the insulating material. Each of the first insulating patterns 111 may expose a portion of sidewalls of the corresponding first trench T1.

After the first insulating patterns 111 are formed, back gate insulating patterns 113 and back gate electrodes BG may be formed in the first trenches T1.

In detail, after the first insulating patterns 111 are formed, a gate insulating layer conformally covering inner walls of the first trenches T1 may be formed, and a gate conductive layer may be formed to fill the first trenches T1 in which the gate insulating layer is formed.

Subsequently, the back gate electrodes BG may be respectively formed in the first trenches T1 by etching the gate conductive layer. While the back gate electrodes BG are formed, the third mask layer M30 may be removed.

In some embodiments, before forming the back gate insulating patterns 113, impurities may be doped into the active layers 110 exposed through the inner walls of the first trenches T1 by performing a vapor doping process or a plasma doping process.

Figure 10:
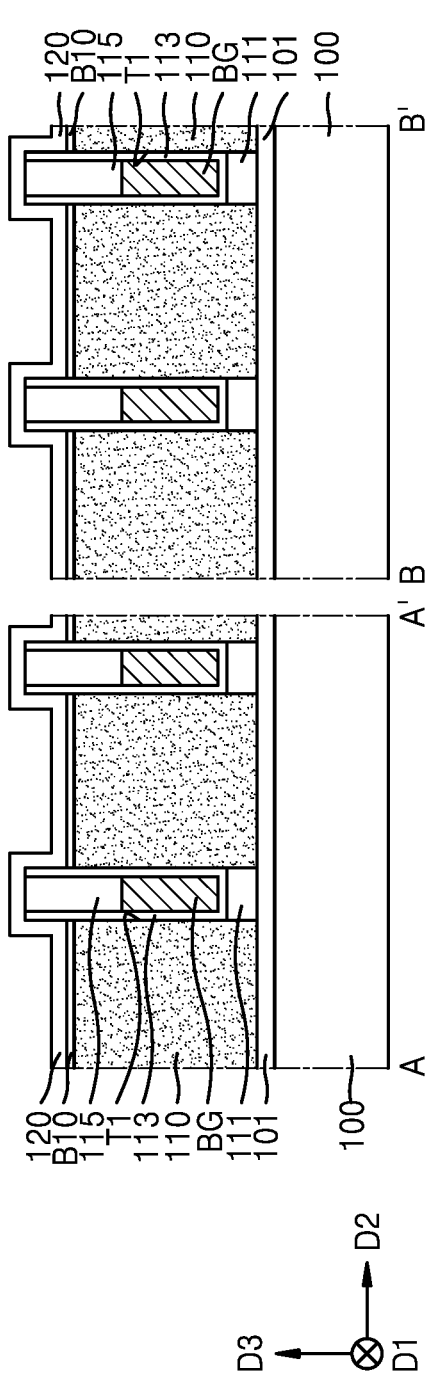

Referring to FIGS. 7 and 10 together, back gate capping patterns 115 may be formed in the first trenches T1 in which the back gate electrodes BG are formed.

The back gate capping patterns 115 may be formed by forming an insulating layer to fill the first trenches T1 in which the back gate electrodes BG are formed and then planarizing the insulating layer to expose an upper surface of the first mask layer M10. When the back gate capping patterns 115 include or is formed of the same material as the second mask layer M20, the second mask layer M20 may be removed by a planarization process for forming the back gate capping patterns 115.

Before the back gate capping patterns 115 are formed, impurities may be doped into the active layers 110 through the first trenches T1 in which the back gate electrodes BG are formed by performing a vapor doping process or a plasma doping process.

After the back gate capping patterns 115 are formed, the first mask layer M10 may be removed, and the back gate capping patterns 115 may have a shape protruding above an upper surface of the buffer layer B10.

Subsequently, a spacer layer 120 may be formed to cover an upper surface of the buffer layer B10, sidewalls of the back gate insulating patterns 113, and upper surfaces of the back gate capping patterns 115 with a uniform thickness. A width of active patterns of VCTs may be determined according to the thickness of the spacer layer 120.

The spacer layer 120 may be formed of an insulating material. The spacer layer 120 may include or may be formed of, for example, silicon oxide, silicon oxynitride, silicon nitride, silicon carbide, or a combination thereof.

Figure 11:
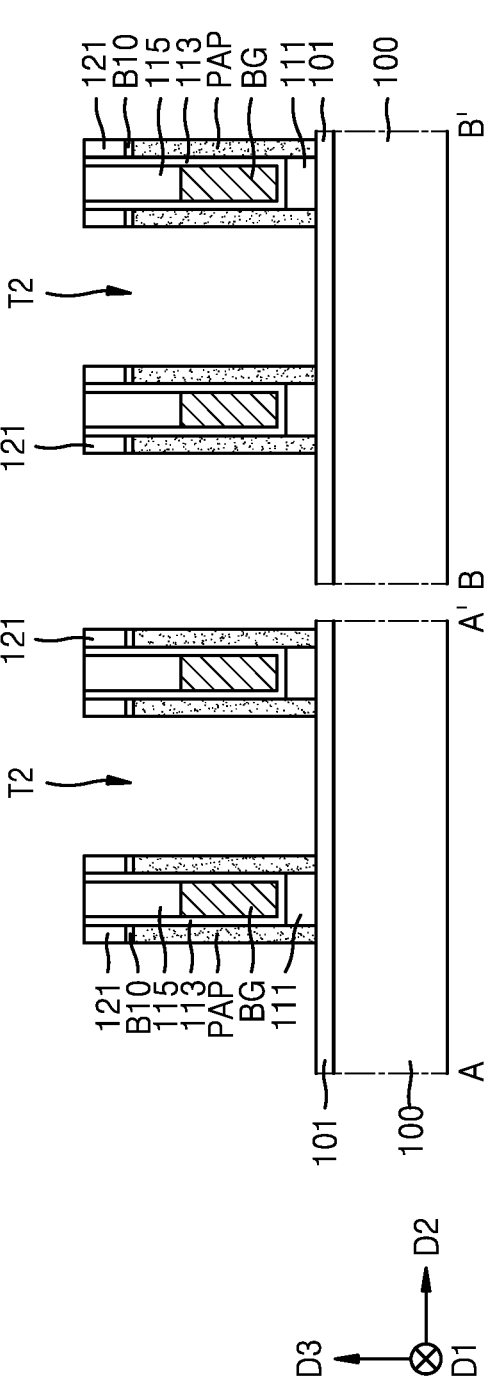

Referring to FIGS. 7 and 11 together, an anisotropic etching process may be performed on the spacer layer 120 to form a pair of spacers 121 on sidewalls of each of the back gate insulating patterns 113.

Next, an anisotropic etching process may be performed on the active layer 110 by using the spacers 121 as an etching mask. Accordingly, a pair of preliminary active patterns PAP separated from each other may be formed on opposite sides of each of the back gate insulating patterns 113.

As the preliminary active patterns PAP are formed, the buried insulating layer 101 may be exposed. The preliminary active patterns PAP may have a line shape extending in parallel with the back gate electrodes BG in the first direction D1, and a second trench T2 may be formed between the preliminary active patterns PAP adjacent to each other in the second direction D2.

Figure 12:
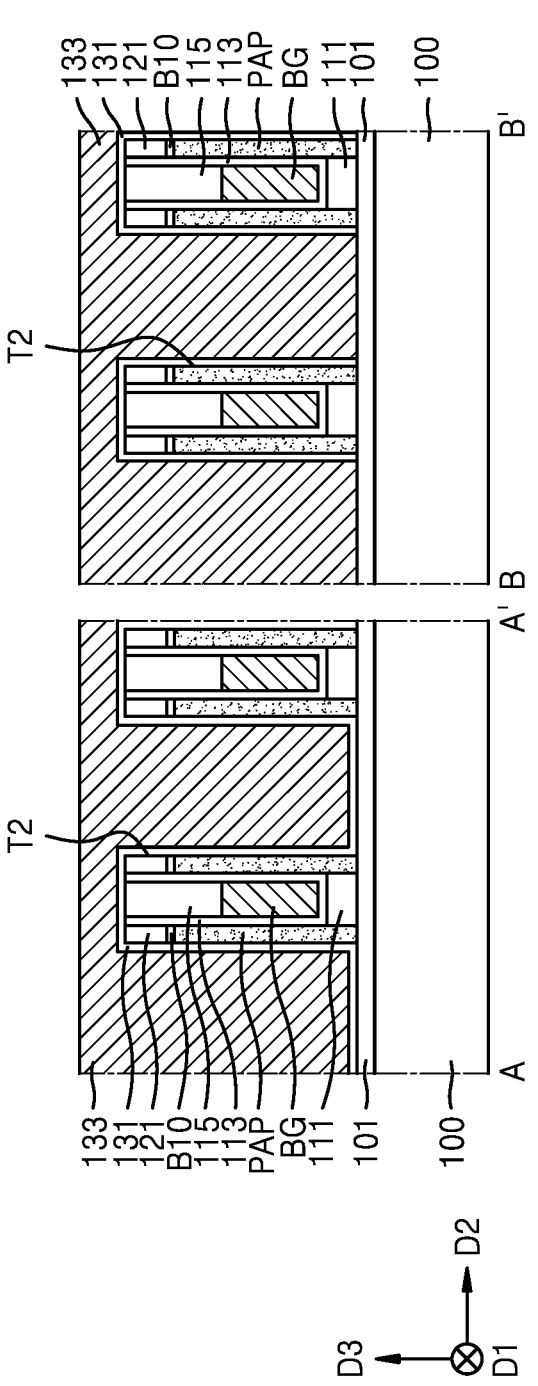

Referring to FIGS. 7 and 12 together, a first etch stop layer 131 may be formed to conformally cover an inner wall of the second trench T2, and a first sacrificial layer 133 may be formed to fill the second trench T2 on which the first etch stop layer 131 is formed.

The first etch stop layer 131 may be formed of an insulating material, for example, silicon oxide. The first sacrificial layer 133 may fill the second trench T2, and may have a substantially flat upper surface. The first sacrificial layer 133 may be formed of an insulating material having etch selectivity with respect to the first etch stop layer 131. In some embodiments, the first sacrificial layer 133 may be any one of a silicon oxide layer formed by using spin on glass (SOG) technology and an insulating material. Terms such as "same," "equal," "planar," "flat," or "coplanar," as used herein encompass near identicality including variations that may occur, for example, due to manufacturing processes. The term "substantially" may be used herein to emphasize this meaning, unless the context or other statements indicate otherwise.

Figure 13:
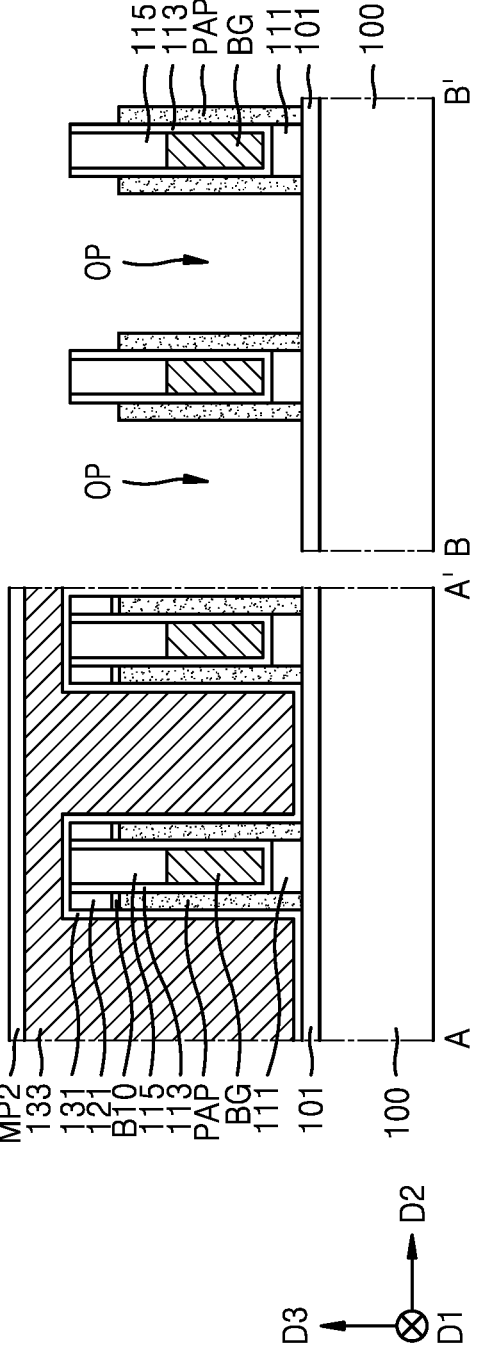

Referring to FIGS. 7 and 13 together, a second mask pattern MP2 may be formed on the first sacrificial layer 133.

The second mask pattern MP2 may be formed of a material having etch selectivity with respect to the first sacrificial layer 133, and may have a line shape extending in the second direction D2. In some embodiments, the second mask pattern MP2 may also have a line shape extending in a diagonal direction with respect to the first direction D1 and the second direction D2.

Subsequently, openings OP exposing portions of the preliminary active patterns PAP may be formed by sequentially etching the first sacrificial layer 133 and the first etch stop layer 131 by using the second mask pattern MP2 as an etching mask. The openings OP may expose the upper surface of the buried insulating layer 101.

During the etching process for the first sacrificial layer 133 and the first etch stop layer 131, the spacers 121 exposed to the second mask pattern MP2 may be removed.

Figure 14:
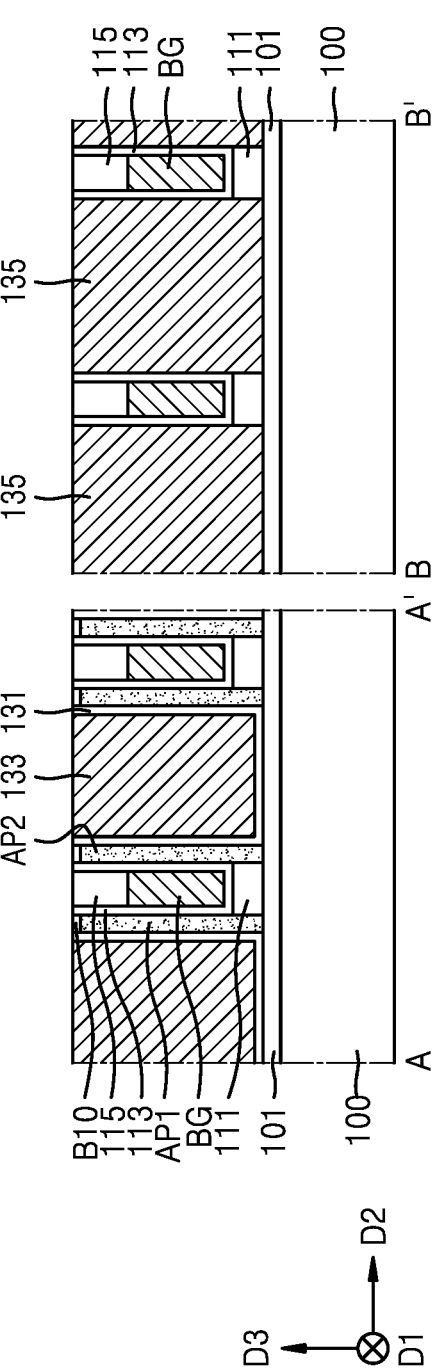

Referring to FIGS. 7 and 14 together, a first active pattern AP1 and a second active pattern AP2 may be formed on opposite sides of each of the back gate insulating patterns 113 by anisotropically etching the preliminary active patterns PAP exposed through the openings OP (refer to FIG. 13).

The first active patterns AP1 may be formed on first sidewalls of the back gate electrodes BG to be spaced apart from each other in the first direction D1, and the second active patterns AP2 may be formed on second sidewalls of the back gate electrodes BG to be spaced apart from each other in the first direction D1. In some embodiments, when the second mask pattern MP2 extends in the diagonal direction, the first active pattern AP1 and the second active pattern AP2 may be arranged to face each other in the diagonal direction.

After the first active patterns AP1 and the second active patterns AP2 are formed, a second sacrificial layer 135 may be filled in the openings OP (refer to FIG. 13). The second sacrificial layer 135 may be formed of an insulating material having etch selectivity with respect to the first etch stop layer 131. In some embodiments, the second sacrificial layer 135 may be formed of the same material as the first sacrificial layer 133.

After the second sacrificial layer 135 is formed, the second mask pattern MP2 may be removed, and a planarization process may be performed on the first sacrificial layer 133 and the second sacrificial layer 135 to expose the upper surfaces of the back gate capping patterns 115.

Figure 15:
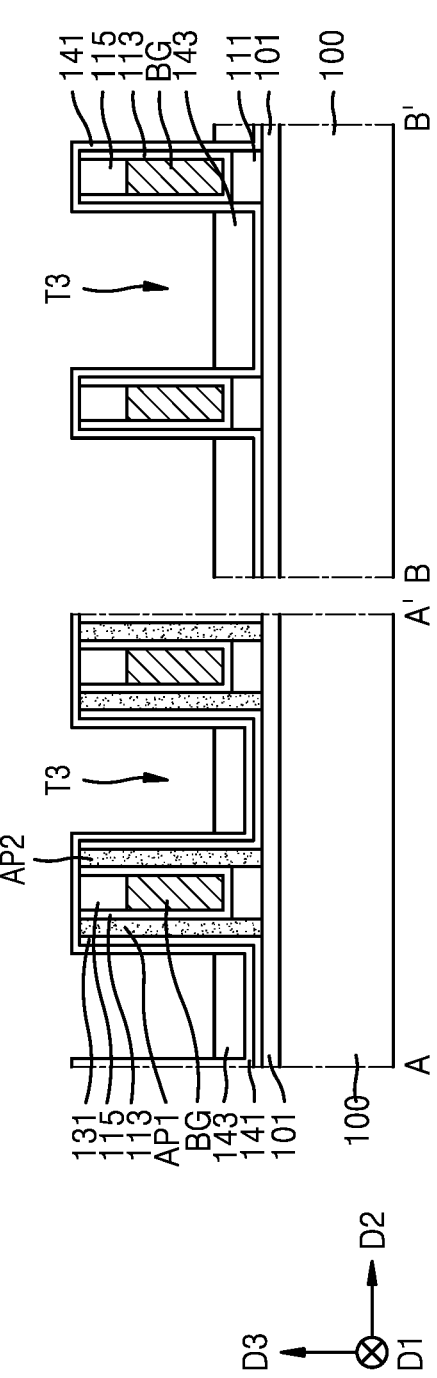

Referring to FIGS. 7 and 15 together, the first sacrificial layer 133 and the second sacrificial layer 135 (refer to FIG. 14) may be removed, and the first etch stop layer 131 may be exposed between the first active pattern AP1 and the second active pattern AP2 facing each other in the second direction D2.

Subsequently, a second etch stop layer 141 may be formed to have a uniform thickness in a third trench T3 in which the first etch stop layer 131 is formed. In detail, the second etch stop layer 141 may be formed on portions of the first etch stop layer 131, the back gate insulating patterns 113, the back gate capping patterns 115, and the buried insulating layer 101. The second etch stop layer 141 may be formed of a material having etch selectivity with respect to the first etch stop layer 131.

A second insulating pattern 143 may be formed to fill a portion of the third trench T3 in which the second etch stop layer 141 is formed.

The second insulating pattern 143 may be formed by forming an insulating layer filling the third trench T3 by using SOG technology and then etching the insulating layer. The second insulating pattern 143 may include or may be formed of fluoride silicate glass (FSG), spin on glass (SOG), tonen silazene (TOSZ), or the like.

A level of an upper surface of the second insulating pattern 143 may vary according to an etching process. In some embodiments, the upper surface of the second insulating pattern 143 may be located at a higher level than a lower surface of the back gate electrode BG. Alternatively, the upper surface of the second insulating pattern 143 may be located at a lower level than the lower surface of the back gate electrode BG.

Figure 16:
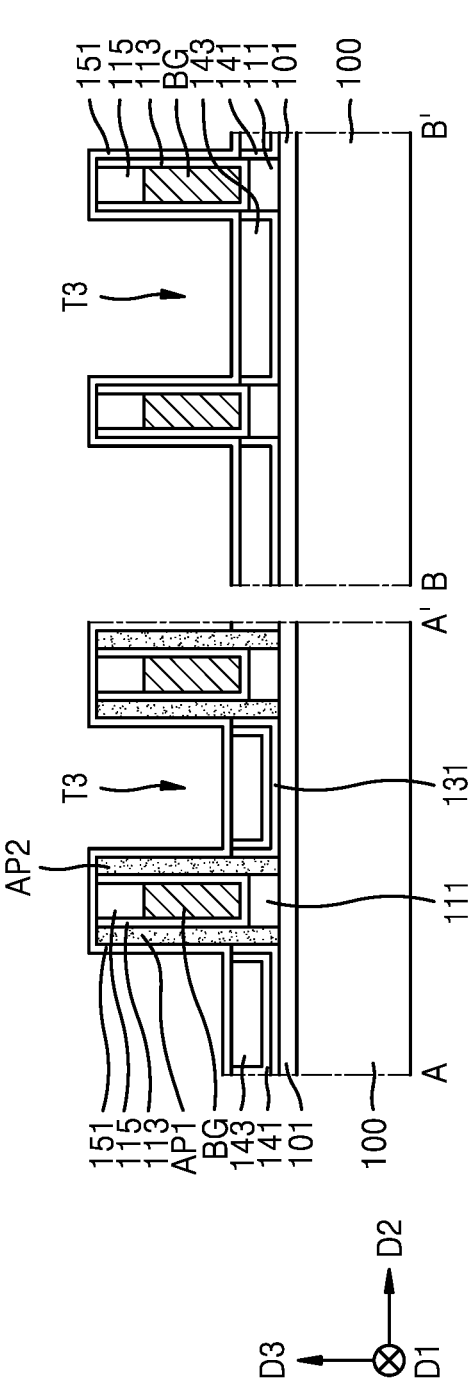

Referring to FIGS. 7 and 16 together, the first active pattern AP1 and the second active pattern AP2 may be exposed in the third trench T3 by etching the first etch stop layer 131 and the second etch stop layer 141 exposed by the second insulating pattern 143.

Subsequently, a gate insulating layer 151 may be formed to conformally cover sidewalls of the first active pattern AP1 and the second active pattern AP2, upper surfaces of the back gate capping patterns 115, and the upper surface of the second insulating pattern 143.

The gate insulating layer 151 may be formed by using any one of physical vapor deposition (PVD), thermal chemical vapor deposition (thermal CVD), low pressure-chemical vapor deposition (LP-CVD), plasma reinforced-chemical vapor deposition (PE-CVD), and atomic layer deposition (ALD) methods.

Figure 17:
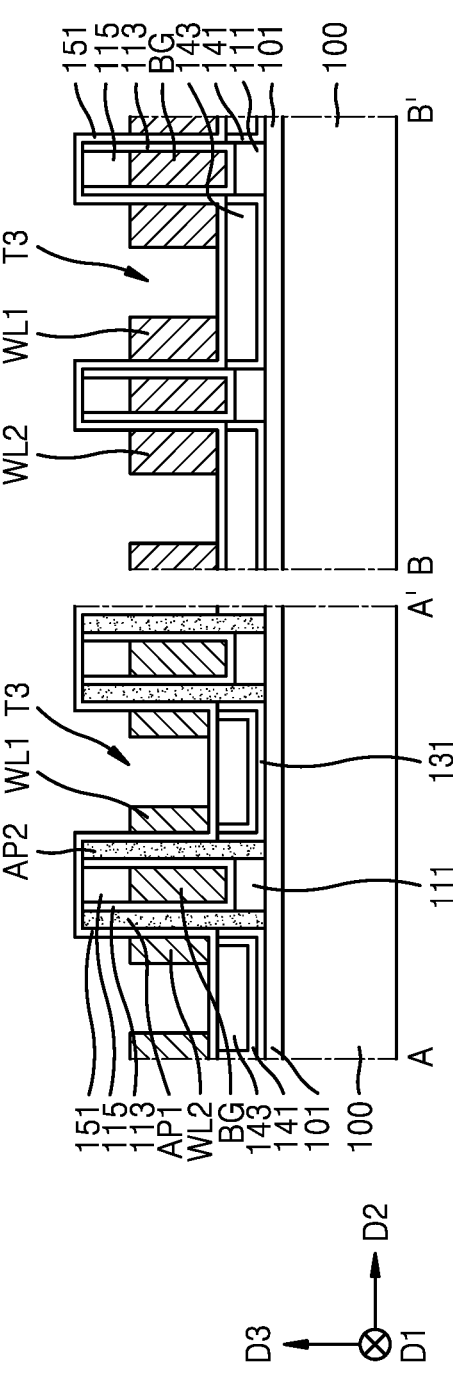

Referring to FIGS. 7 and 17 together, after the gate insulating layer 151 is formed, a first word line WL1 and a second word line WL2 may be formed on the sidewalls of the first active pattern AP1 and the second active pattern AP2.

The operation of forming the first word line WL1 and the second word line WL2 may include an operation of forming a gate conductive layer conformally covering the gate insulating layer 151 and then performing an anisotropic etching process on the gate conductive layer. Here, a thickness of the gate conductive layer may be less than half of a width of the third trench T3. The gate conductive layer may define a gap region in the third trench T3, and may be formed on the gate insulating layer 151.

During the anisotropic etching process for the gate conductive layer, the gate insulating layer 151 may be used as an etch stop layer, or the gate insulating layer 151 may be over-etched, and thus, the second insulating pattern 143 may be exposed. The first word line WL1 and the second word line WL2 may have various shapes according to the anisotropic etching process for the gate conductive layer.

Upper surfaces of the first word line WL1 and the second word line WL2 may be located at a lower level than upper surfaces of the first active pattern AP1 and the second active pattern AP2.

After the first word line WL1 and the second word line WL2 are formed, impurities may be doped into the active layers 110 through the gate insulating layer 151 exposed by the first word line WL1 and the second word line WL2 by performing a vapor doping process or a plasma doping process.

Figure 18:
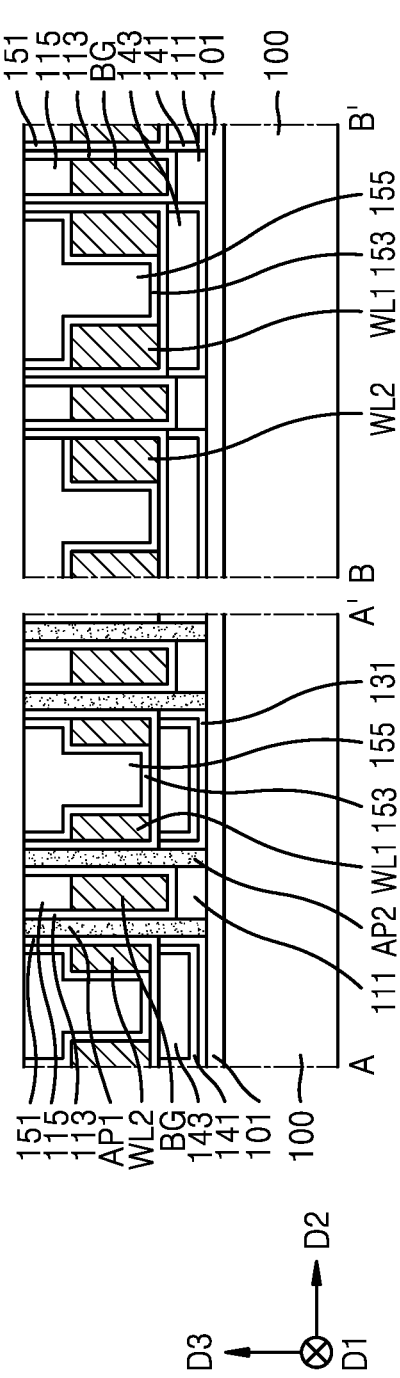

Referring to FIGS. 7 and 18 together, a first capping layer 153 and a third insulating layer 155 may be sequentially formed in the third trench T3 (refer to FIG. 17) in which the first word line WL1 and the second word line WL2 are formed.

In detail, the first capping layer 153 may be conformally formed on the entire surface of the first substrate 100. The first capping layer 153 may include or may be formed of, for example, silicon nitride, silicon oxynitride, silicon carbide, or a combination thereof. The first capping layer 153 may cover surfaces of the first word line WL1 and the second word line WL2.

Subsequently, a third insulating layer 155 may be formed to fill the third trench T3 (refer to FIG. 17) in which the first capping layer 153 is formed. Here, the third insulating layer 155 may be formed of a different insulating material from the first capping layer 153.

Next, a planarization process may be performed on the third insulating layer 155 and the first capping layer 153 to expose upper surfaces of the back gate capping patterns 115. Accordingly, the upper surfaces of the first active pattern AP1 and the second active pattern AP2 may be exposed.

Figure 19:
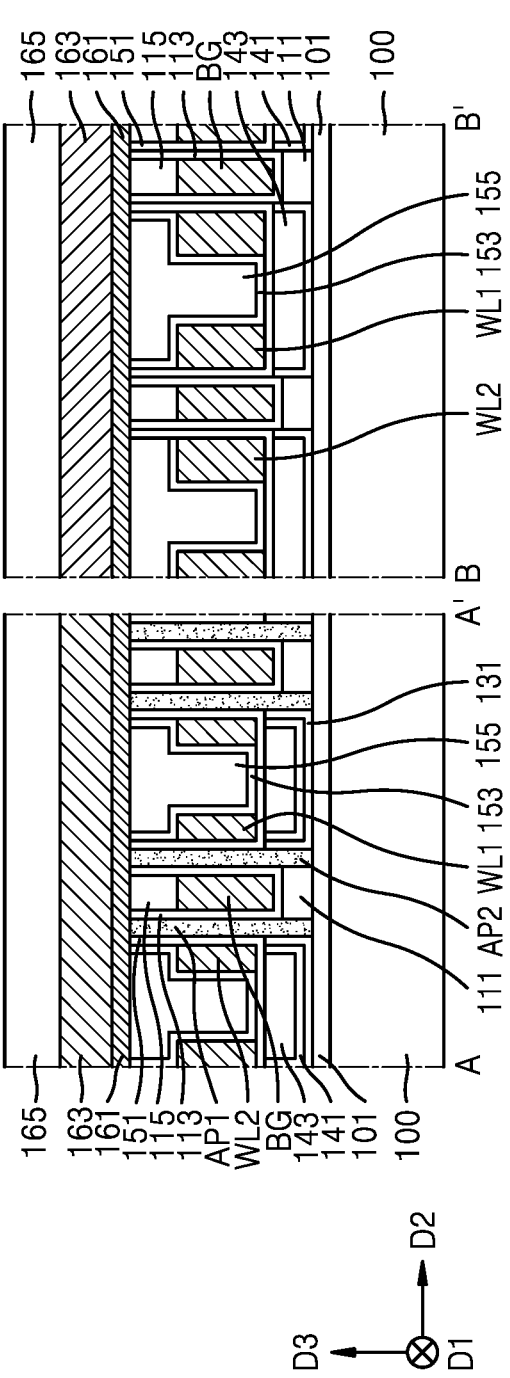

Referring to FIGS. 7 and 19 together, a polysilicon layer 161 may be formed on the entire surface of the first substrate 100.

The polysilicon layer 161 may contact the upper surfaces of the first active pattern AP1 and the second active pattern AP2. Next, a metal layer 163 and a hard mask layer 165 may be sequentially formed on the polysilicon layer 161.

The metal layer 163 may be formed of conductive metal nitride and metal (e.g., tungsten, titanium, tantalum, or the like). The hard mask layer 165 may be formed of an insulating material such as silicon nitride and silicon oxynitride.

Figure 20:
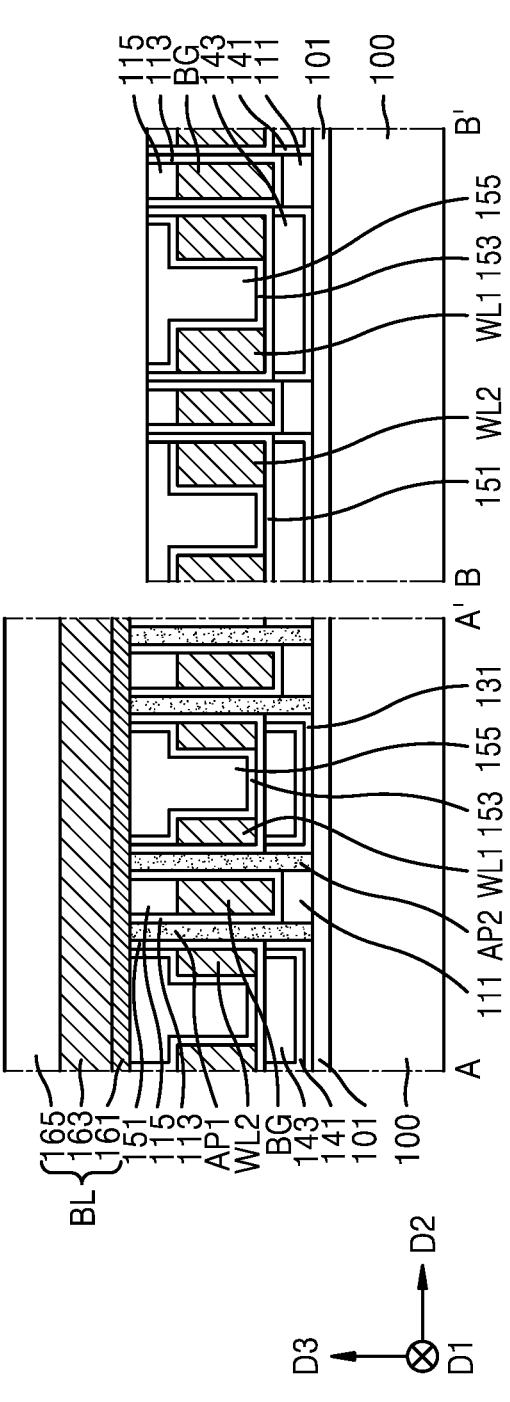

Referring to FIGS. 7 and 20 together, a mask pattern (not shown) having a line shape extending in the second direction D2 may be formed on the hard mask layer 165, and the hard mask layer 165, the metal layer 163, and the polysilicon layer 161 may be sequentially and anisotropically etched by using the mask pattern.

Accordingly, bit lines BL may be formed to be spaced apart from each other in the first direction D1 and extend in the second direction D2. When the bit lines BL are formed, portions of the back gate capping pattern 115 may be etched together.

Figure 21:
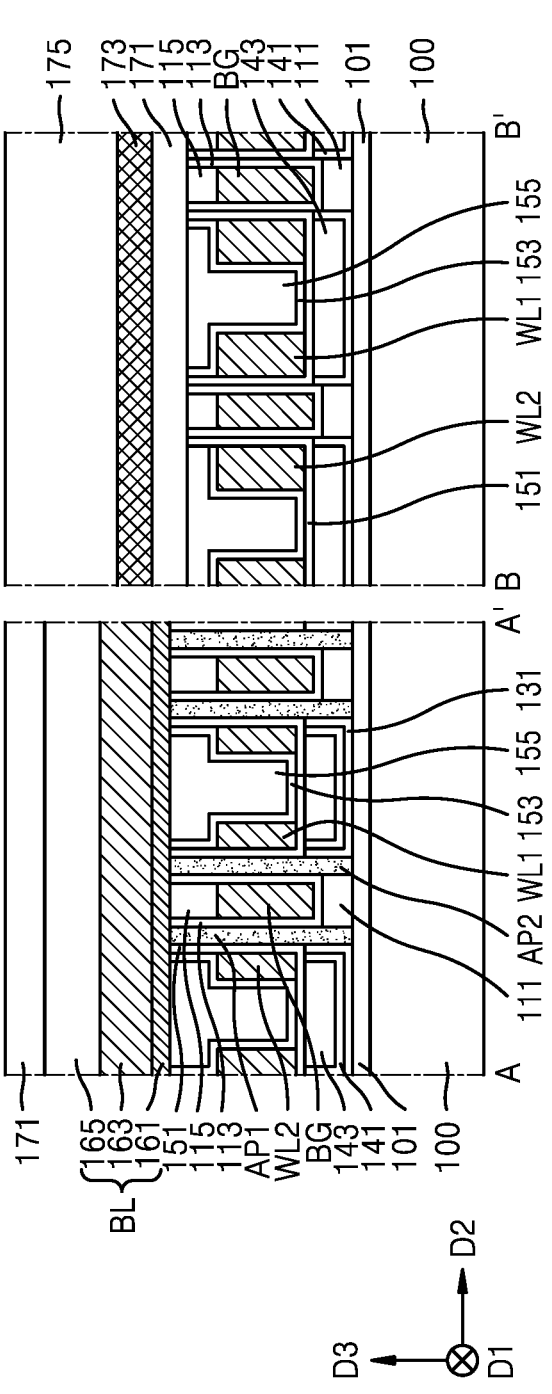

Referring to FIGS. 7 and 21 together, after the bit lines BL are formed, a third insulating layer 171 defining a gap region may be formed between the bit lines BL.

The third insulating layer 171 may have a substantially uniform thickness, and may be formed on the entire surface of the first substrate 100. The thickness of the third insulating layer 171 may be less than half of a gap between adjacent bit lines BL. A gap region may be defined by the third insulating layer 171 between the bit lines BL. The gap region may extend in the second direction D2 in parallel with the bit lines BL.

After the third insulating layer 171 is formed, a shielding line including a conductive material or gap structures 173 including an insulating material may be formed in the gap regions of the third insulating layer 171.

Each of the gap structures 173 may be formed between the bit lines BL. In some embodiments, the operation of forming the gap structures 173 may include an operation of forming a shielding layer on the third insulating layer 171 to fill the gap region, and an operation of recessing an upper surface of the shielding layer.

Upper surfaces of the gap structures 173 may be located at a lower level than the upper surfaces of the bit lines BL. The gap structures 173 may include or may be formed of, for example, metal, such as tungsten (W), titanium (T1), nickel (Ni), and cobalt (Co). In some embodiments, the gap structures 173 may include or may be formed of a conductive material including carbon, such as graphene. The gap structures 173 may also include a low-k dielectric material having a lower dielectric constant than the third insulating layer 171.

After the gap structures 173 are formed, capping insulating patterns 175 may be formed on the gap structures 173. The operation of forming the capping insulating patterns 175 may include an operation of forming a capping insulating layer filling the gap regions in which the gap structures 173 are formed, and an operation of performing a planarization process on the capping insulating layer and the third insulating layer 171 to expose the upper surfaces of the bit lines BL, e.g., an upper surface of the hard mask layer 165.

Figure 22:
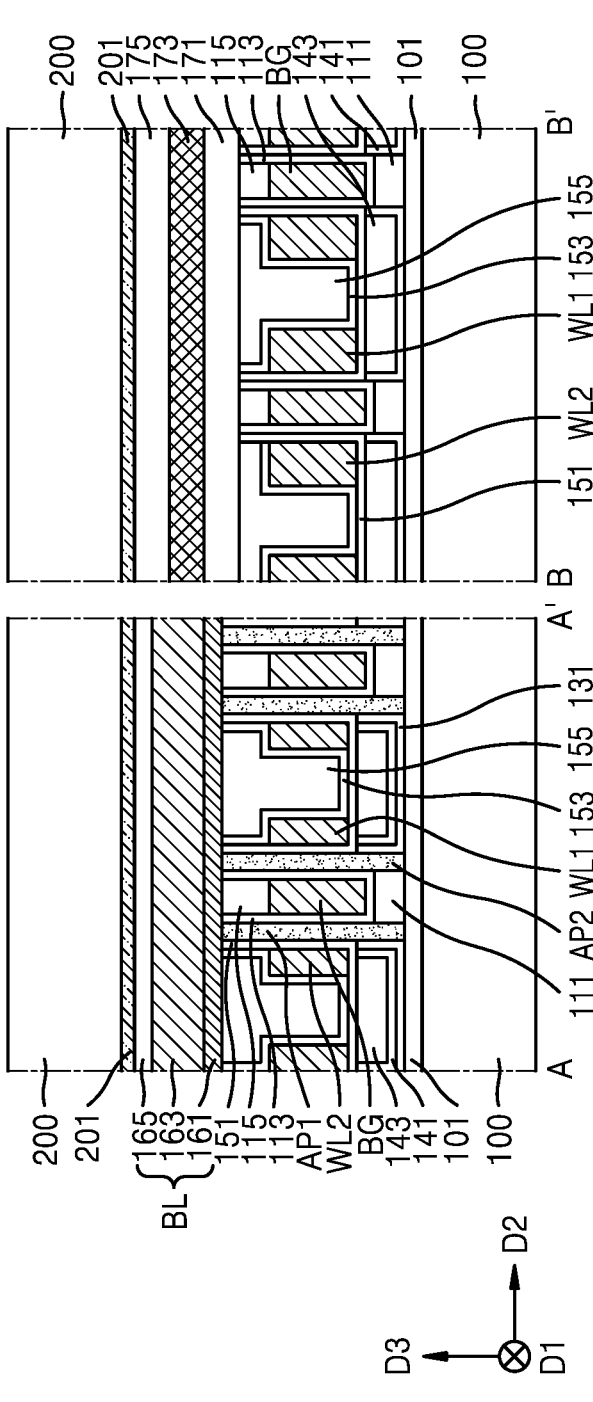

Referring to FIGS. 7 and 22 together, the first substrate 100 on which the back gate electrodes BG, the first word line WL1 and the second word line WL2, the first active pattern AP1 and the second active pattern AP2, and the bit lines BL are formed may be bonded to a second substrate 200.

The second substrate 200 may be bonded to the upper surfaces of the bit lines BL, i.e., the upper surface of the hard mask layer 165 and the upper surfaces of the capping insulating patterns 175 by using a second bonding interface layer 201. The second substrate 200 may include or may be formed of, for example, single crystal silicon, glass, quartz, or the like. The second bonding interface layer 201 may include or may be formed of, for example, silicon carbonitride.

Figure 23:
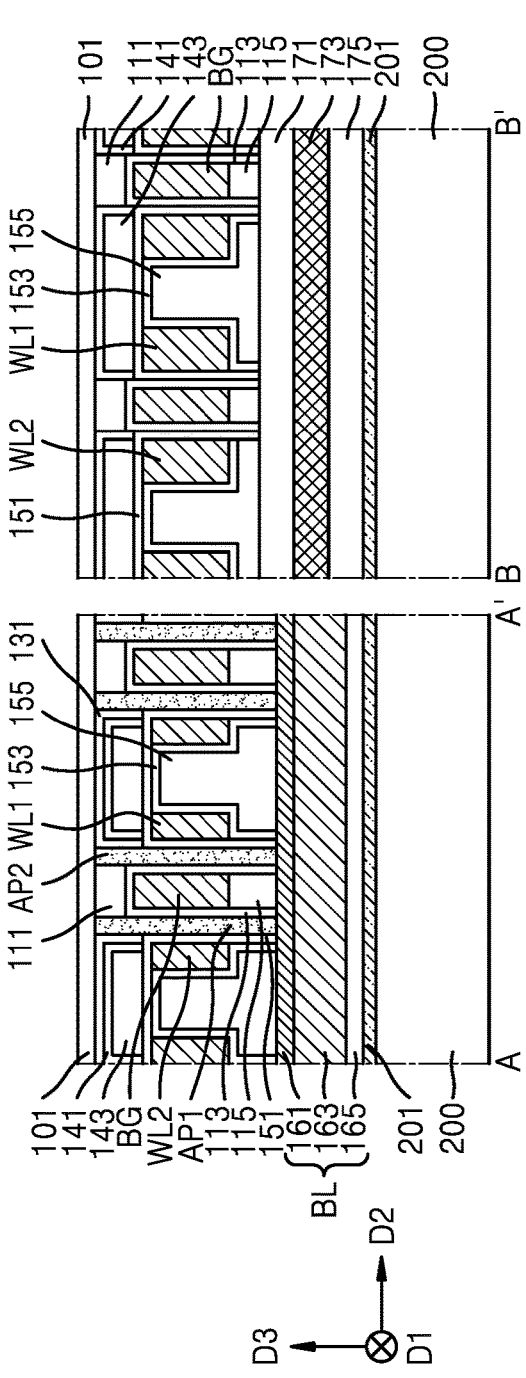

Referring to FIGS. 7 and 23 together, after bonding the second substrate 200 by using the second bonding interface layer 201, a rear surface lapping process of removing the first substrate 100 (refer to FIG. 22) may be performed.

The operation of removing the first substrate 100 (refer to FIG. 22) may include an operation of exposing the buried insulating layer 101 by sequentially performing a grinding process and a wet etching process.

Figure 24:
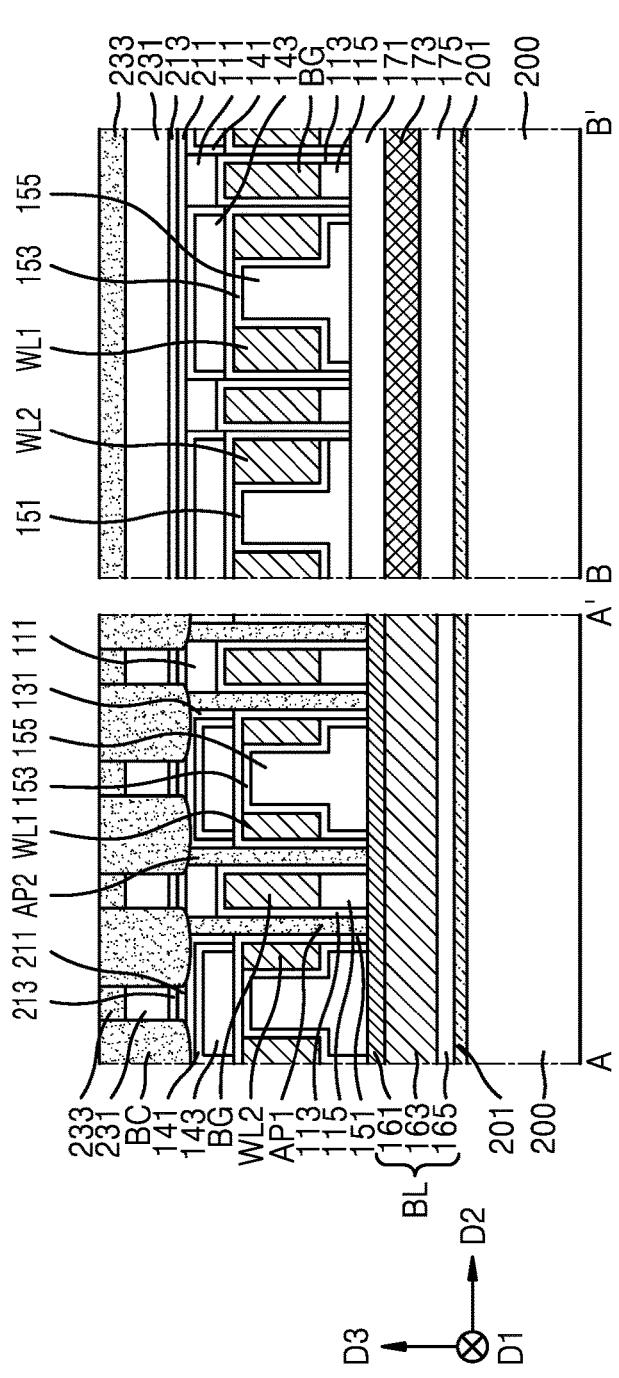

Referring to FIGS. 7 and 24 together, the buried insulating layer 101 may be removed to expose the first active pattern AP1 and the second active pattern AP2, the first insulating patterns 111, and the back gate insulating patterns 113.

Next, a third etch stop layer 211 and a fourth etch stop layer 213 may be sequentially formed in the memory cell region CELL. The third etch stop layer 211 may be formed of silicon oxide, and may be formed on the first active pattern AP1 and the second active pattern AP2, the first insulating patterns 111, and the back gate insulating patterns 113. The fourth etch stop layer 213 may be formed of a material having etch selectivity with respect to the third etch stop layer 211, and may be formed of, for example, silicon nitride.

An interlayer insulating layer 231 and an etch stop layer 233 may be formed in the memory cell region CELL. The etch stop layer 233 may be formed of an insulating material having etch selectivity with respect to the interlayer insulating layer 231.

Subsequently, contact patterns BC may be formed to pass through the interlayer insulating layer 231 and the etch stop layer 233 and to be connected to the first active pattern AP1 and the second active pattern AP2. The operation of forming the contact patterns BC may include an operation of patterning the interlayer insulating layer 231 and the etch stop layer 233 to form holes exposing the first active pattern AP1 and the second active pattern AP2, respectively, an operation of forming a conductive layer filling the holes, and an operation of planarizing the conductive layer to expose an upper surface of the etch stop layer 233.

Figure 25:
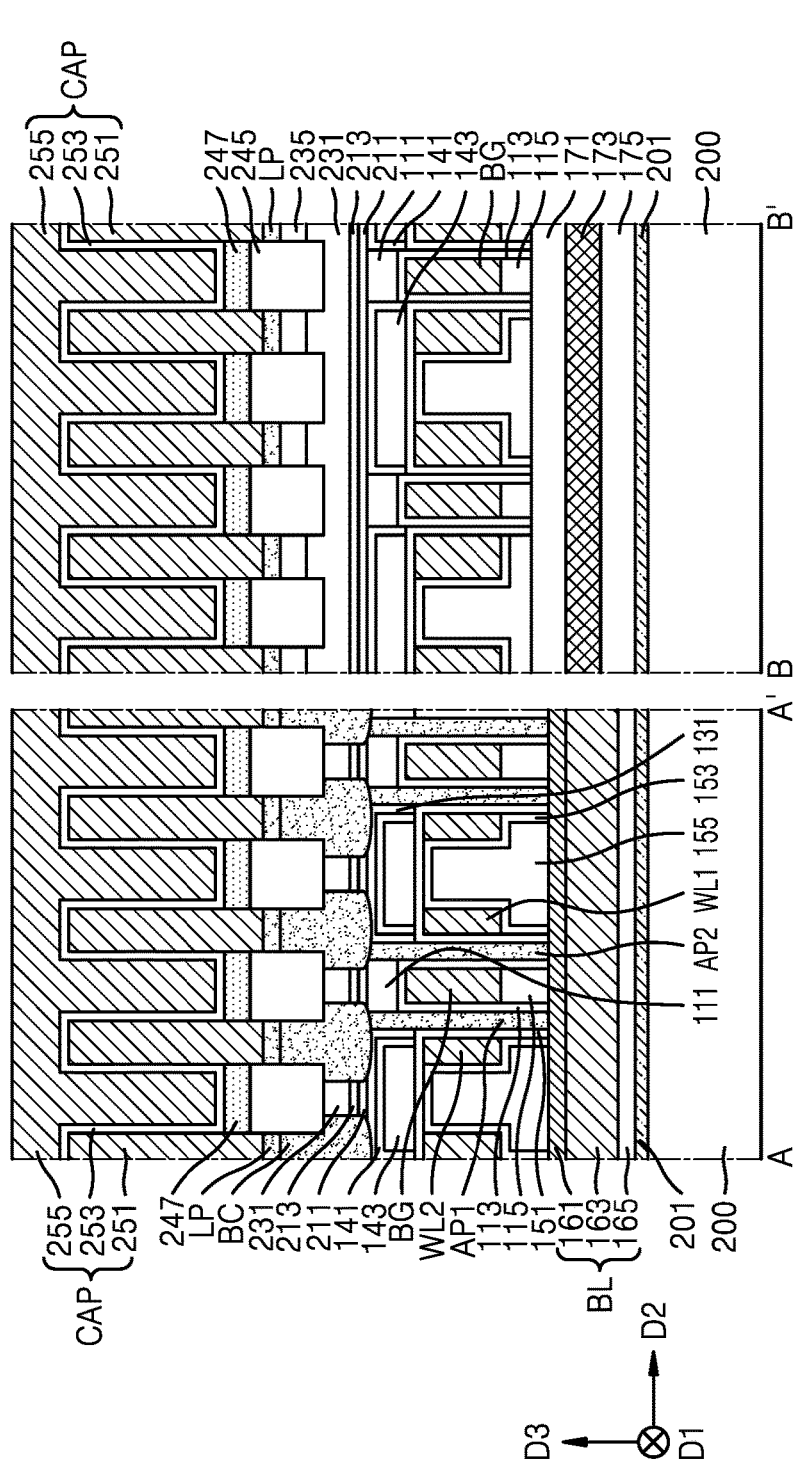

Referring to FIGS. 7 and 25 together, the conductive layer may be patterned to form landing pads LP connected to the contact patterns BC.

The operation of forming the landing pads LP may include an operation of forming a recess region by anisotropically etching the conductive layer, and the etch stop layer 233 and the interlayer insulating layer 231 between the contact patterns BC by using mask patterns, and an operation of forming an isolation insulating pattern 245 by burying an insulating material in the recess region. Here, during a time when the recess region is formed, portions of the contact patterns BC may be etched. An upper surface of the isolation insulating pattern 245 may be substantially coplanar with upper surfaces of the landing pads LP.

Next, capacitors CAP as information storage devices may be formed on the landing pads LP. In detail, storage electrodes 251 may be respectively formed on the landing pads LP, and a capacitor dielectric layer 253 may be formed to conformally cover surfaces of the storage electrodes 251. Subsequently, a plate electrode 255 may be formed on the capacitor dielectric layer 253.

Figure 26:
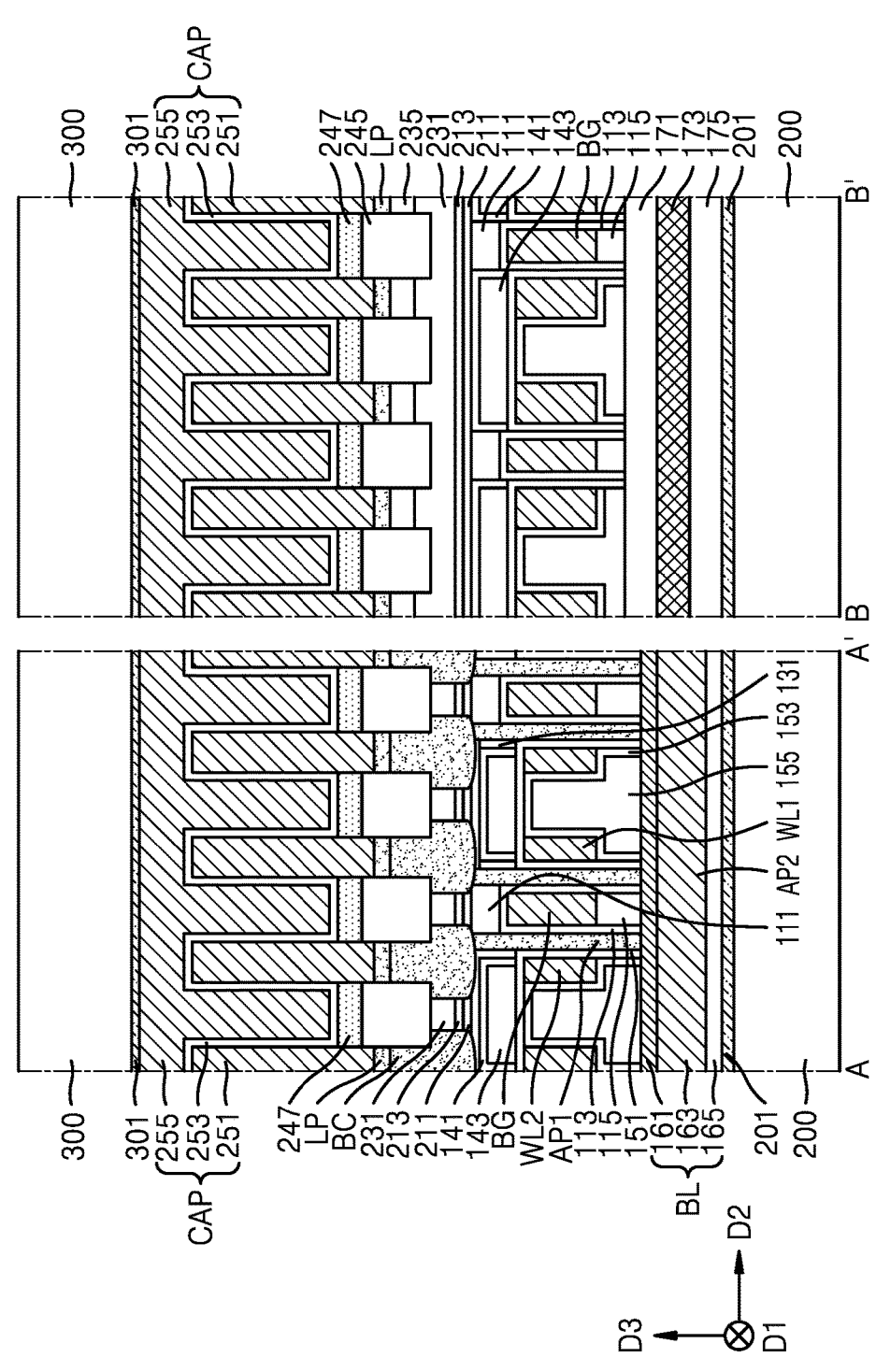

Referring to FIGS. 7 and 26 together, the second substrate 200 on which the capacitors CAP are formed may be bonded to a third substrate 300.

The third substrate 300 may be bonded to upper surfaces of the capacitors CAP, i.e., an upper surface of the plate electrode 255, by using a third bonding interface layer 301. The third substrate 300 may include or may be formed of, for example, single crystal silicon, glass, quartz, or the like. The third bonding interface layer 301 may include or may be formed of, for example, silicon carbonitride.

Figure 27:
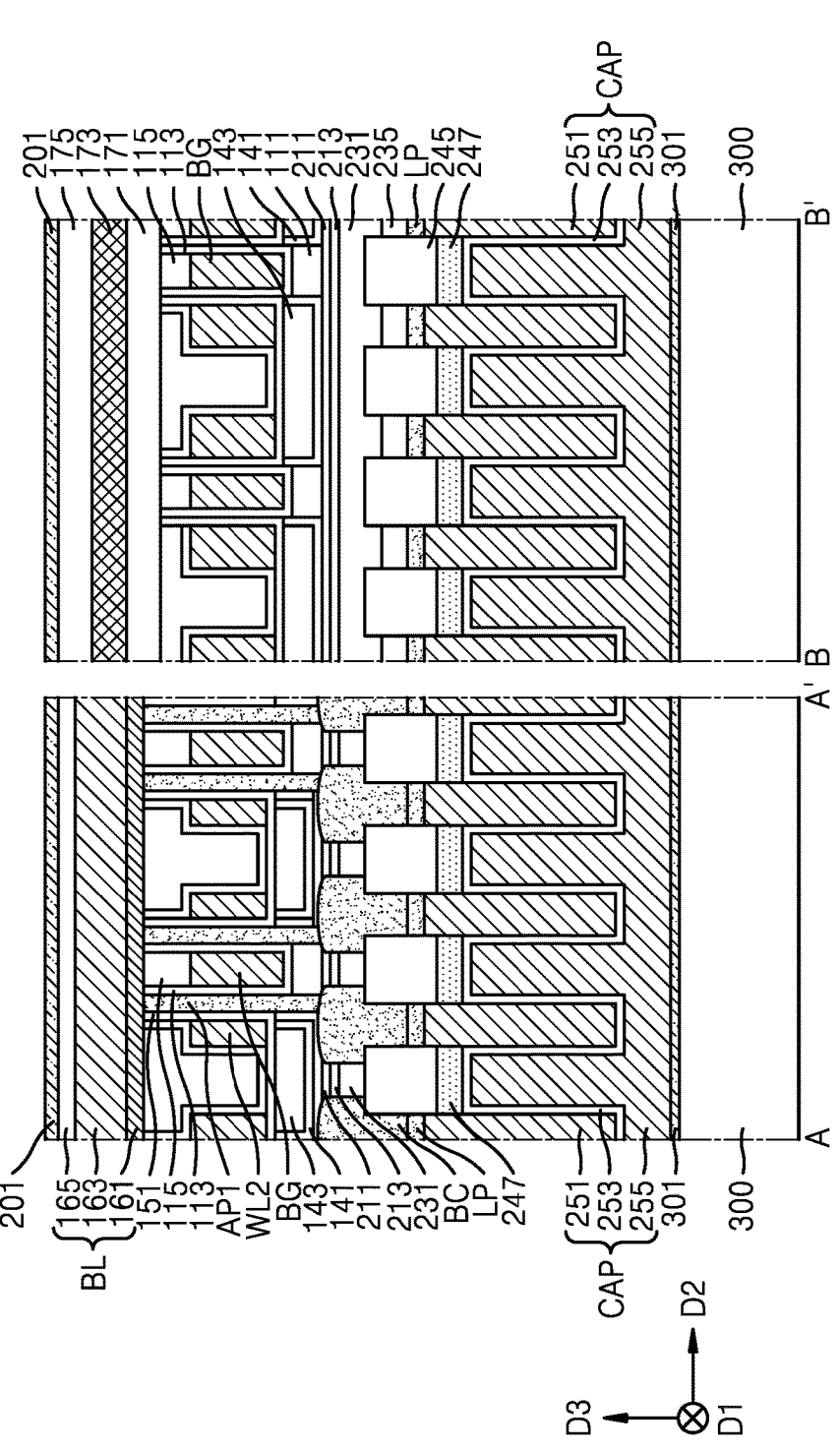

Referring to FIGS. 7 and 27 together, after bonding the third substrate 300 by using the third bonding interface layer 301, a rear surface lapping process of removing the second substrate 200 (refer to FIG. 26) may be performed.

The operation of removing the second substrate 200 (refer to FIG. 26) may include an operation of exposing the second bonding interface layer 201 on the bit line BL by sequentially performing a grinding process and a wet etching process.

Figure 28:

Referring to FIGS. 7 and 28 together, a first insulating layer 260 may be formed on the second bonding interface layer 201, and first bonding pads BP1 may be formed to be electrically connected to the bit line BL.

The bit line BL may be electrically connected to the first bonding pad BP1 through a first bonding via BV1. The first bonding via BV1 may be in contact with the bit line BL by passing through the first insulating layer 260 and the second bonding interface layer 201. The first bonding pad BP may be provided in plural.

The first bonding pads BP1 may be formed on the first insulating layer 260. In some embodiments, upper surfaces of the first bonding pads BP1 may be coplanar with an upper surface of the first insulating layer 260. In other words, the first bonding pads BP1 may not protrude from the upper surface of the first insulating layer 260.

Each of the first bonding vias BV1 and the first bonding pads BP1 may be formed of a conductive material including copper (Cu), gold (Au), silver (Ag), aluminum (Al), tungsten (W), titanium (T1), tantalum (Ta), or a combination thereof.

Figure 29:
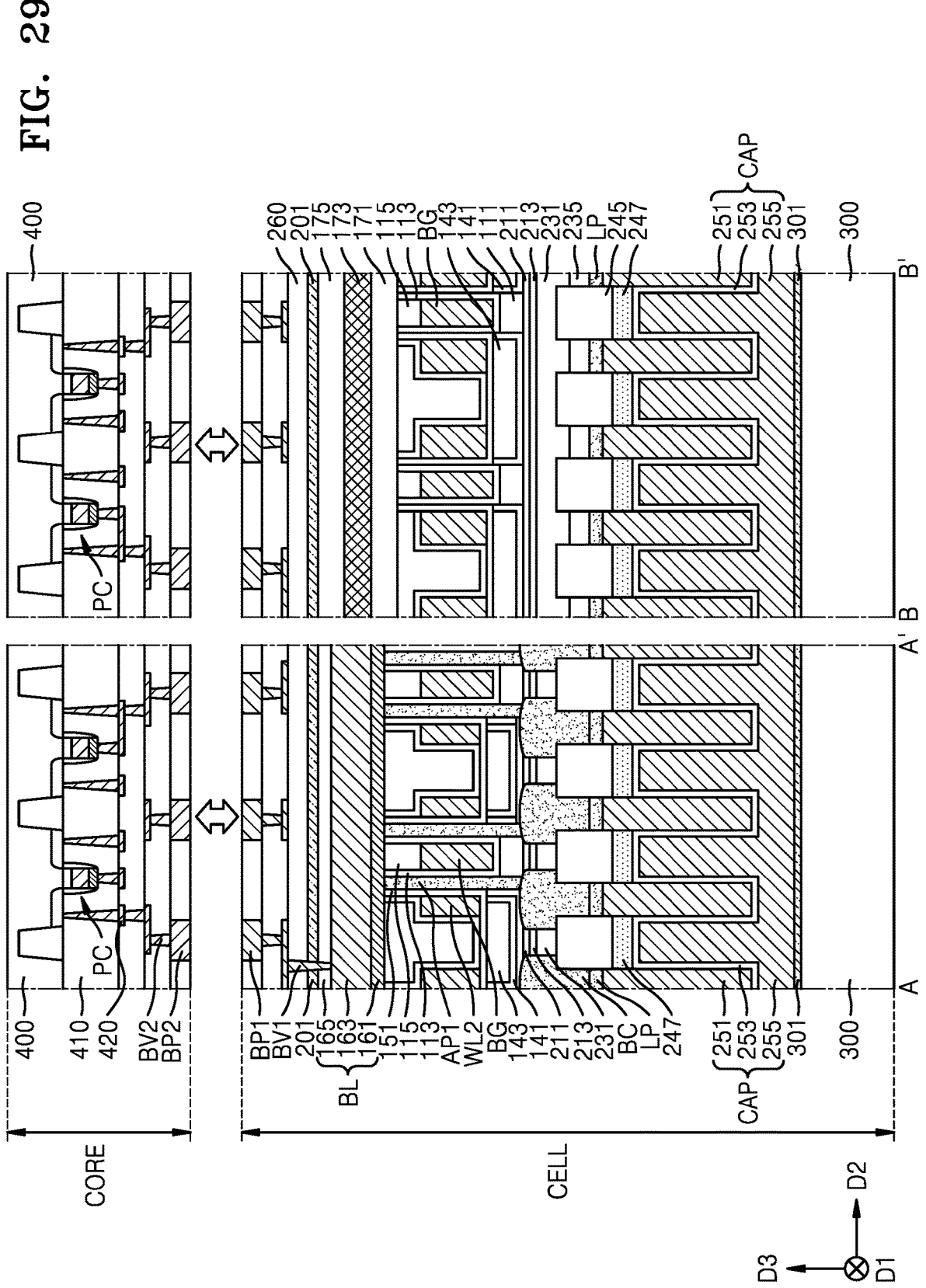

Referring to FIGS. 7 and 29 together, a fourth substrate 400 including a core/peripheral region CORE and PERI (refer to FIG. 1) may be provided.

A second insulating layer 410 may be formed on the fourth substrate 400 to cover peripheral circuits PC and second wiring layers 420. The peripheral circuits PC may include a command decoder, a control logic, an address buffer, a row decoder, a column decoder, a sense amplifier, a sub word line driver, and data input/output circuits. The second wiring layers 420 may have a multilayer structure arranged at different vertical levels.

The peripheral circuits PC may be electrically connected to second bonding pads BP2 through second bonding vias BV2. The second bonding vias BV2 may be in contact with the second wiring layers 420. The combined structure of each of the bonding pads BP2 and a corresponding one of the second bonding vias BV2 may pass through the second insulating layer 410.

The second bonding pads BP2 may be formed on the second insulating layer 410. In some embodiments, upper surfaces of the second bonding pads BP2 may be coplanar with an upper surface of the second insulating layer 410. In other words, the second bonding pads BP2 may not protrude from the upper surface of the second insulating layer 410. For example, the second bonding pads BP2 may not protrude into the second insulating layer 410.

Each of the second bonding vias BV2 and the second bonding pads BP2 may be formed of a conductive material including copper (Cu), gold (Au), silver (Ag), aluminum (Al), tungsten (W), titanium (T1), tantalum (Ta), or a combination thereof. The peripheral circuits PC may be electrically connected to the second bonding pads BP2 through the second bonding vias BV2.

Figure 30:
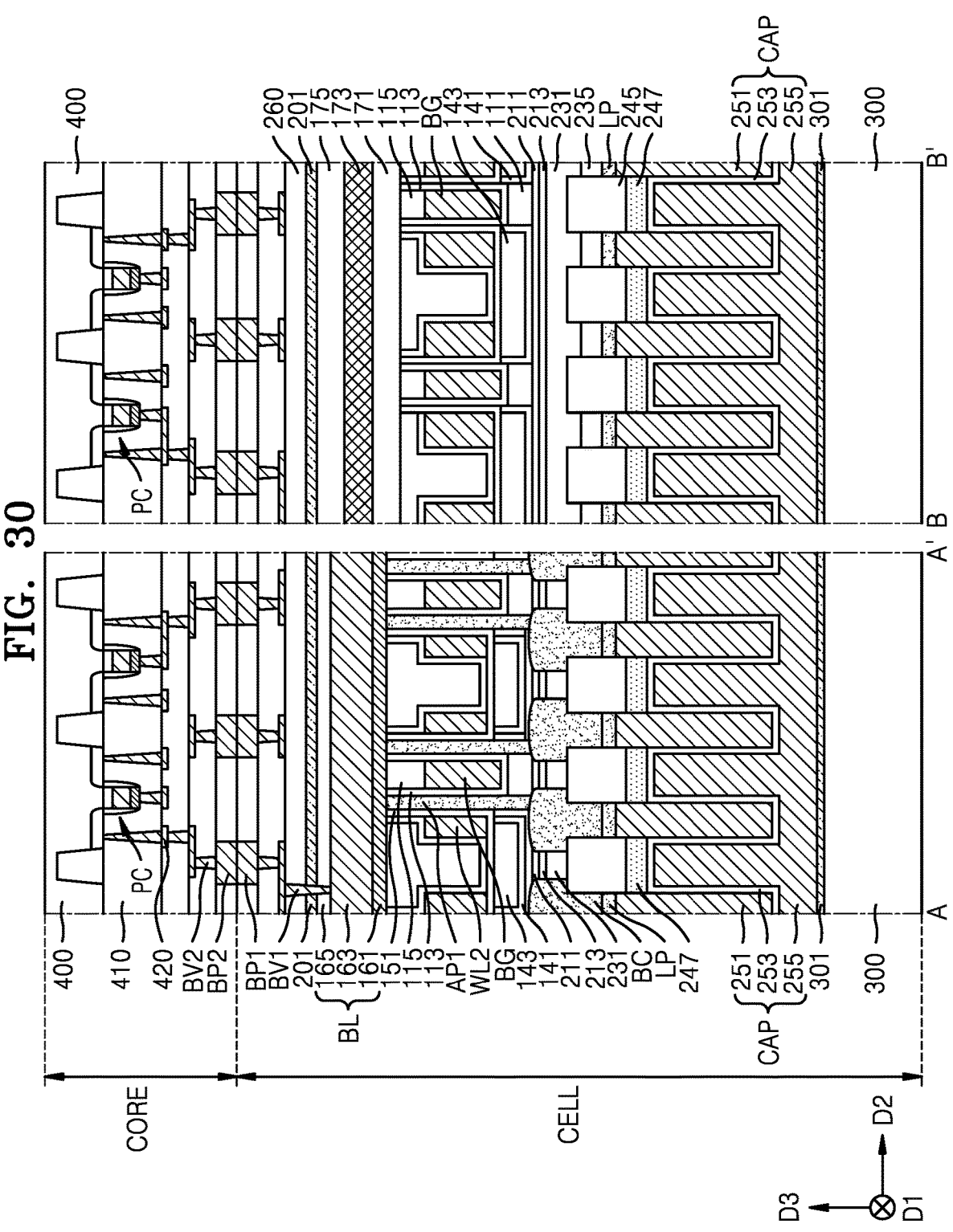

Referring to FIGS. 7 and 30 together, the fourth substrate 400 on which the second bonding pads BP2 are formed may be bonded to the third substrate 300 on which the first bonding pads BP1 are formed.

In detail, the first bonding pads BP1 and the second bonding pads BP2 may be aligned with each other, and then may be bonded to each other by (Cu-to-Cu) direct bonding. Direct bonding may refer to connecting a first chip (here, a cell memory chip) and a second chip (here, a peripheral circuit chip) to each other by a bonding method.

In some embodiments, the first bonding pads BP1 and the second bonding pads BP2 corresponding to each other may be expanded by heat to be in contact with each other, and then metal atoms such as Cu may diffuse such that each of the first bonding pads BP1 and a corresponding one of the second bonding pads BP2 may be integrated into one body, thereby bonding the first bonding pads BP1 to the second bonding pads BP2, respectively.

Figure 31:
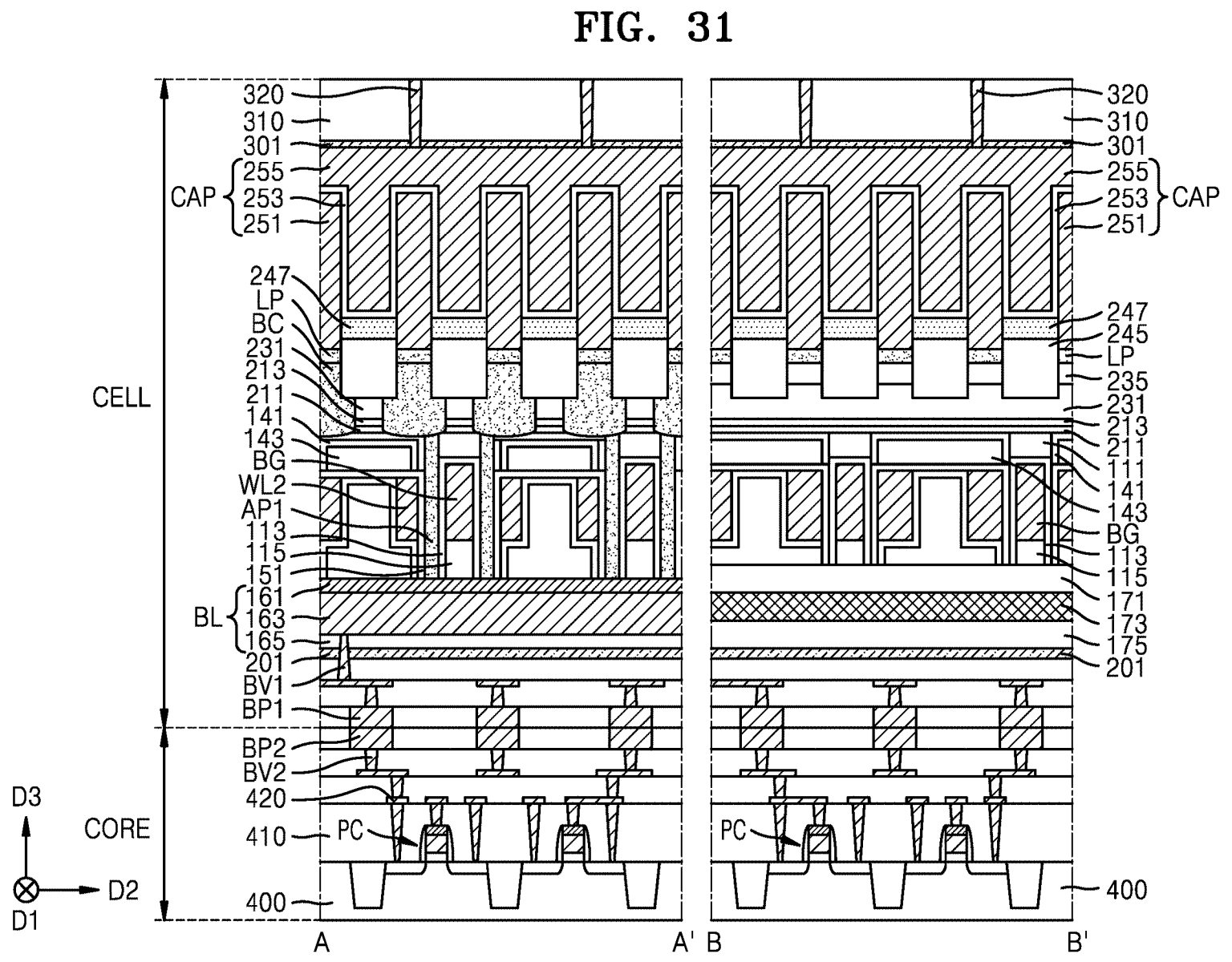

Referring to FIGS. 7 and 31 together, after bonding the fourth substrate 400 by using the direct bonding, a rear surface lapping process of removing the third substrate 300 (refer to FIG. 30) may be performed.

The operation of removing the third substrate 300 (refer to FIG. 30) may include an operation of exposing the third bonding interface layer 301 on the capacitors CAP by sequentially performing a grinding process and a wet etching process.

Next, a third insulating layer 310 may be formed to fully cover the upper surface of the third bonding interface layer 301. Subsequently, cell contact plugs 320 may be formed to be connected to the plate electrode 255 by passing through the third insulating layer 310 and the third bonding interface layer 301.

The cell contact plugs 320 may be a portion of a conductive connection structure electrically connected to peripheral circuits of the peripheral region PERI (refer to FIG. 1) arranged outside the memory cell region CELL.

While the inventive concept has been particularly shown and described with reference to embodiments thereof, it will be understood that various changes in form and details may be made therein without departing from the spirit and scope of the following claims.

What is claimed is:

1. A method of fabricating a semiconductor device, the method comprising:

providing a first substrate including a buried insulating layer and an active layer in a memory cell region;

forming, within the active layer, a back gate electrode extending in a first direction;

forming first and second active patterns on the buried insulating layer by patterning the active layer, wherein a first side of the first active pattern and a second side of the second active pattern are disposed on opposite sides of the back gate electrode, respectively;

forming first and second word lines on a third side, opposite to the first side, of the first active pattern and on a fourth side, opposite to the second side, of the second active pattern;

forming a bit line contacting first surfaces of the first and second active patterns and extending in a second direction across the first and second word lines;

bonding a second substrate onto the bit line;

exposing second surfaces, opposite to the first surfaces, of the first and second active patterns by removing the first substrate and the buried insulating layer;

forming first and second contact patterns contacting the second surfaces of the first and second active patterns, respectively;

forming first and second capacitors electrically connected to the first and second contact patterns, respectively;

bonding a third substrate onto the first and second capacitors;

exposing the bit line by removing the second substrate; and forming a first bonding pad electrically connected to the bit line.

2. The method of claim 1, further comprising:

forming a plurality of bonding pads including the first bonding pad that is electrically connected to the bit line, wherein the plurality of bonding pads are spaced apart from each other in an orthogonal direction with respect to the second direction, or are spaced apart from each other in a honeycomb shape.

3. The method of claim 1, wherein the first bonding pad, when viewed in a plan view, has a shape selected from a square shape, a hexagonal shape, a circular shape, and an elliptical shape.

4. The method of claim 1, wherein the bonding of the second substrate onto the bit line includes:

forming, between the bit line and the second substrate, a second bonding interface layer including an insulating material, and wherein the bonding of the third substrate onto the first and second capacitors includes:

forming, between the third substrate and each of the first and second capacitors, a third bonding interface layer including substantially the same insulating material as the second bonding interface layer.

5. The method of claim 4, wherein the same insulating material of the second bonding interface layer and the third bonding interface layer includes silicon carbonitride (SiCN).

6. The method of claim 1, further comprising:

providing a fourth substrate including a peripheral circuit in a core/peripheral region and an insulating layer covering the peripheral circuit;

forming second bonding pads disposed on the insulating layer and electrically connected to the peripheral circuit;

bonding the first bonding pad to a corresponding second bonding pad of the second bonding pads; and exposing the first and second capacitors by removing the third substrate.

7. The method of claim 6, wherein the memory cell region overlaps at least partially the core/peripheral region in a vertical direction perpendicular to an upper surface of the first substrate.

8. The method of claim 6, wherein a first width of the first bonding pad is different from second widths of the second bonding pads, and wherein the bonding of the first bonding pad to the corresponding second bonding pad is performed by copper-to-copper (Cu-to-Cu) direct bonding.

9. The method of claim 6, further comprising:

forming, after the exposing of the first and second capacitors, first and second cell contact plugs electrically connected to the first and second capacitors, respectively, wherein the forming of the first and second capacitors includes:

in each of the first and second capacitors, forming a capacitor dielectric layer located between a storage electrode and a plate electrode, wherein the plate electrode is shared by the first and second capacitors, and wherein each of the first and second cell contact plugs is electrically connected to the storage electrode of a corresponding capacitor of the first and second capacitors.

10. The method of claim 9, wherein the first and second cell contact plugs are electrically connected to the peripheral circuit arranged in the core/peripheral region that does not overlap the memory cell region in a vertical direction perpendicular to an upper surface of the first substrate.

11. A method of fabricating a semiconductor device, the method comprising:

forming, on a first substrate, a buried insulating layer, a back gate electrode extending in a first direction on the buried insulating layer, and first and second active patterns on the buried insulating layer, wherein a first side of the first active pattern and a second side of the second active pattern are disposed on opposite sides of the back gate electrode, respectively;

forming first and second word lines on a third side, opposite to the first side, of the first active pattern and a fourth side, opposite the second side, of the second active pattern;

forming a bit line contacting the first and second active patterns and extending in a second direction across the first and second word lines;

forming a second bonding interface layer including an insulating material on the bit line, and bonding a second substrate onto the bit line;

removing the first substrate and the buried insulating layer to expose the first and second active patterns;

forming first and second contact patterns contacting the first and second active patterns, respectively;

forming first and second landing pads contacting the first and second contact patterns, respectively;

forming first and second storage electrodes electrically connected to the first and second landing pads, respectively;

forming a capacitor dielectric layer and a plate electrode to cover the first and second storage electrodes;

forming a third bonding interface layer including an insulating material on the plate electrode, and bonding a third substrate onto the plate electrode;

removing the second substrate to expose the second bonding interface layer;

forming a first bonding via passing through the second bonding interface layer and electrically connected to the bit line; and forming a first bonding pad contacting the first bonding via.

12. The method of claim 11, further comprising:

providing a fourth substrate including a peripheral circuit and an insulating layer covering the peripheral circuit;

forming second bonding vias passing through the insulating layer and electrically connected to the peripheral circuit;

forming second bonding pads disposed on the insulating layer and electrically connected to the second bonding vias, respectively;

bonding the first bonding pad to a corresponding second bonding pad of the second bonding pads; and exposing the third bonding interface layer by removing the third substrate.

13. The method of claim 12, wherein the peripheral circuit includes a row decoder, a column decoder, a sense amplifier, and a control logic.

14. The method of claim 12, wherein a portion of the second bonding interface layer is located underneath the bit line, and a portion of the third bonding interface layer is located on the plate electrode.

15. The method of claim 14, wherein each of insulating materials constituting a portion of the second bonding interface layer and a portion of the third bonding interface layer includes silicon carbonitride (SiCN).

16. A method of fabricating a semiconductor device, the method comprising:

fabricating a first semiconductor chip including a memory cell region;

fabricating a second semiconductor chip including a core/peripheral region; and directly bonding the first semiconductor chip to the second semiconductor chip, wherein the fabricating of the first semiconductor chip includes:

providing a first substrate including a buried insulating layer and an active layer in the memory cell region;

forming, within the active layer, a back gate electrode extending in a first direction;

forming first and second active patterns on the buried insulating layer by patterning the active layer, wherein a first side of the first active pattern and a second side of the second active pattern are disposed on opposite sides of the back gate electrode, respectively;

forming first and second word lines on a third side, opposite to the first side, of the first active pattern and on a fourth side, opposite to the second side, of the second active pattern;

forming a bit line contacting first surfaces of the first and second active patterns and extending in a second direction across the first and second word lines;

bonding a second substrate onto the bit line;

exposing second surfaces, opposite to the first surfaces, of the first and second active patterns by removing the first substrate and the buried insulating layer;

forming first and second contact patterns contacting the second surfaces of the first and second active patterns, respectively;

forming first and second capacitors electrically connected to the first and second contact patterns, respectively;

bonding a third substrate onto the first and second capacitors;

exposing the bit line by removing the second substrate; and forming a first bonding pad electrically connected to the bit line, wherein the fabricating of the second semiconductor chip includes:

providing a fourth substrate including a peripheral circuit in the core/peripheral region and an insulating layer covering the peripheral circuit; and forming second bonding pads disposed on the insulating layer and electrically connected to the peripheral circuit, and wherein the directly bonding the first semiconductor chip to the second semiconductor chip includes:

bonding the first bonding pad to a corresponding second bonding pad of the second bonding pads; and exposing the first and second capacitors by removing the third substrate.

17. The method of claim 16, wherein the first bonding pad, when viewed in a plan view, is formed in any one selected from a square shape, a hexagonal shape, a circular shape, and an elliptical shape, and wherein the first bonding pad is bonded to the corresponding second bonding pads using copper-to-copper (Cu-to-Cu) direct bonding.

18. The method of claim 16, wherein the bonding of the second substrate onto the bit line includes:

forming, between the bit line and the second substrate, a second bonding interface layer including silicon carbonitride (SiCN), and wherein the bonding of the third substrate onto the first and second capacitors includes:

forming, between the third substrate and each of the first and second capacitors, a third bonding interface layer including silicon carbonitride (SiCN).

19. The method of claim 16, wherein the forming of the back gate electrode includes:

forming a first trench exposing the buried insulating layer by patterning the active layer;

forming a first insulating pattern filling a portion of the first trench;

forming a back gate insulating layer in the first trench in which the first insulating pattern is formed;

forming a conductive layer filling a portion of the first trench in which the back gate insulating layer is formed; and forming a back gate capping pattern on an upper surface of the conductive layer.

20. The method of claim 16, wherein the forming of the first and second active patterns includes:

forming first and second spacers on the active layer on the opposite sides of the back gate electrode, respectively;

forming first and second preliminary active patterns extending in the first direction by anisotropically etching the active layer by using the first and second spacers as an etching mask, respectively; and patterning each of the first and second preliminary active patterns.

* * * * *